United States Patent [19]

Watanabe

[11] Patent Number: 5,073,241
[45] Date of Patent: Dec. 17, 1991

[54] METHOD FOR CARBON FILM PRODUCTION

[75] Inventor: Misuzu Watanabe, Kawasaki, Japan

[73] Assignee: Kabushiki Kaisha Meidenshae, Tokyo, Japan

[21] Appl. No.: 7,747

[22] Filed: Jan. 28, 1987

[30] Foreign Application Priority Data

| Jan. 31, 1986 | [JP] | Japan | 61-19566 |
| Jan. 31, 1986 | [JP] | Japan | 61-19567 |
| Jan. 31, 1986 | [JP] | Japan | 61-19568 |
| Jan. 31, 1986 | [JP] | Japan | 61-19569 |
| Jan. 31, 1986 | [JP] | Japan | 61-19570 |

[51] Int. Cl.$^5$ ............................................. C23C 14/34
[52] U.S. Cl. ........................ 204/192.15; 204/192.25; 204/192.26; 204/192.28
[58] Field of Search .............. 204/192.15, 192.16, 204/192.22, 192.26, 192.27, 192.28, 192.29, 192.25, 298, 298.07

[56] References Cited

U.S. PATENT DOCUMENTS

| 3,840,451 | 10/1974 | Golyanov et al. | 204/192.15 |
| 4,365,015 | 12/1982 | Kitajima et al. | 204/192.26 X |
| 4,414,085 | 11/1983 | Wickersham et al. | 204/192.15 |
| 4,486,286 | 12/1984 | Levin et al. | 204/192.15 X |
| 4,597,844 | 7/1986 | Hiraki et al. | 204/298 |

FOREIGN PATENT DOCUMENTS

| 39189 | 8/1973 | Australia . | |
| 0156069 | 2/1985 | European Pat. Off. | 204/192.15 |
| 0155178 | 9/1985 | European Pat. Off. . | |
| 2160899 | 1/1986 | United Kingdom . | |

OTHER PUBLICATIONS

McKenzie et al., "Hydrogenated ... mixtures", Applied Optics, Oct. 1982, vol. 21, No. 20, pp. 3615–3617.
Hiraki et al., "Tetrahedral ... Substrate", Solid State Communications, vol. 50, No. 8, pp. 713–716, 1984.

Primary Examiner—Nam X. Nguyen
Attorney, Agent, or Firm—Bachman & LaPointe

[57] ABSTRACT

A carbon film producing method utilizing a reactive sputtering process for projecting carbon particles from a graphite target electrode to deposit a very thin layer on a substrate. The reactive sputtering process is performed at a predetermined pressure in an atmosphere of hydrogen gas mixed at a predetermined ratio to another kind of gas.

4 Claims, 16 Drawing Sheets

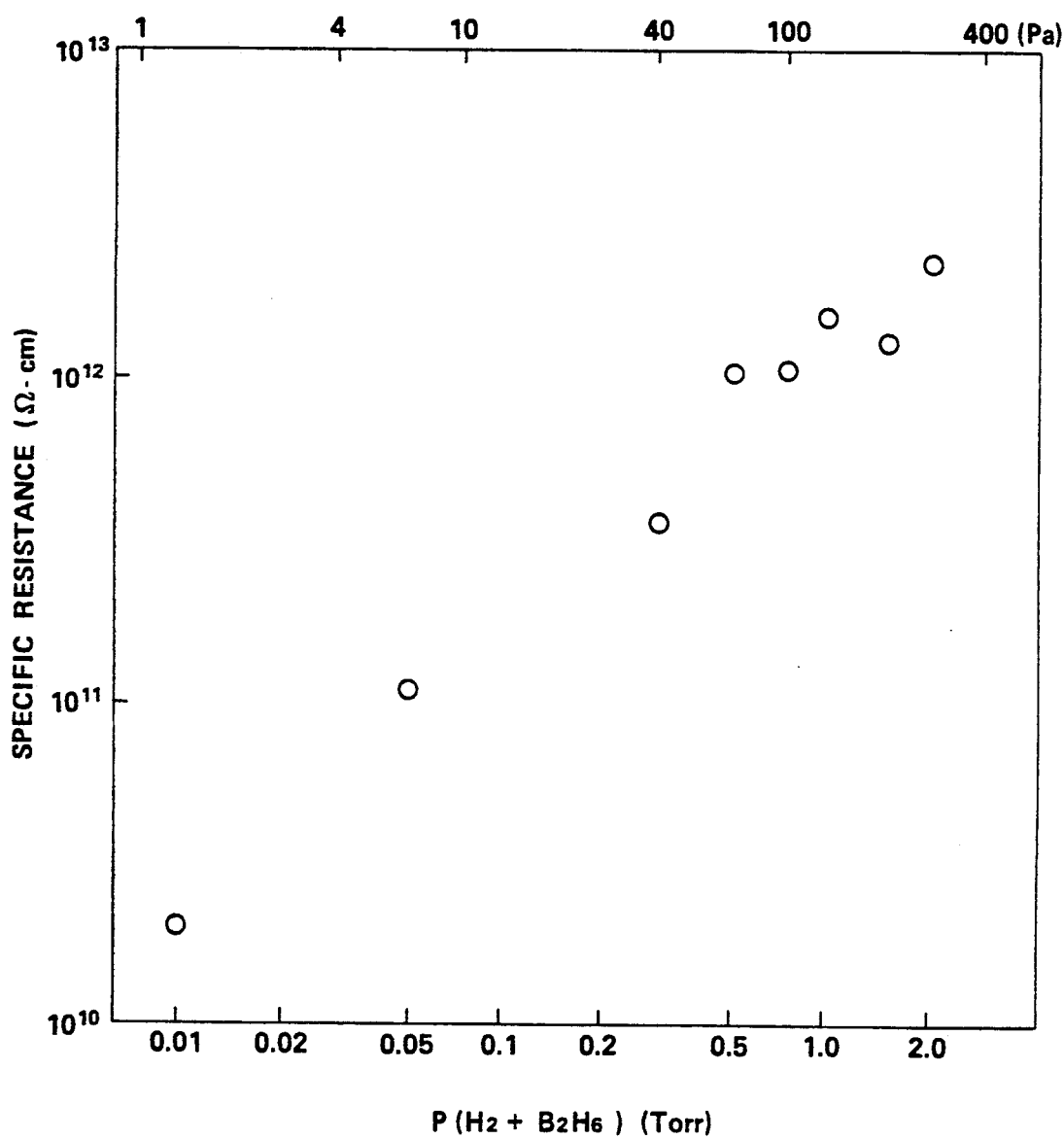

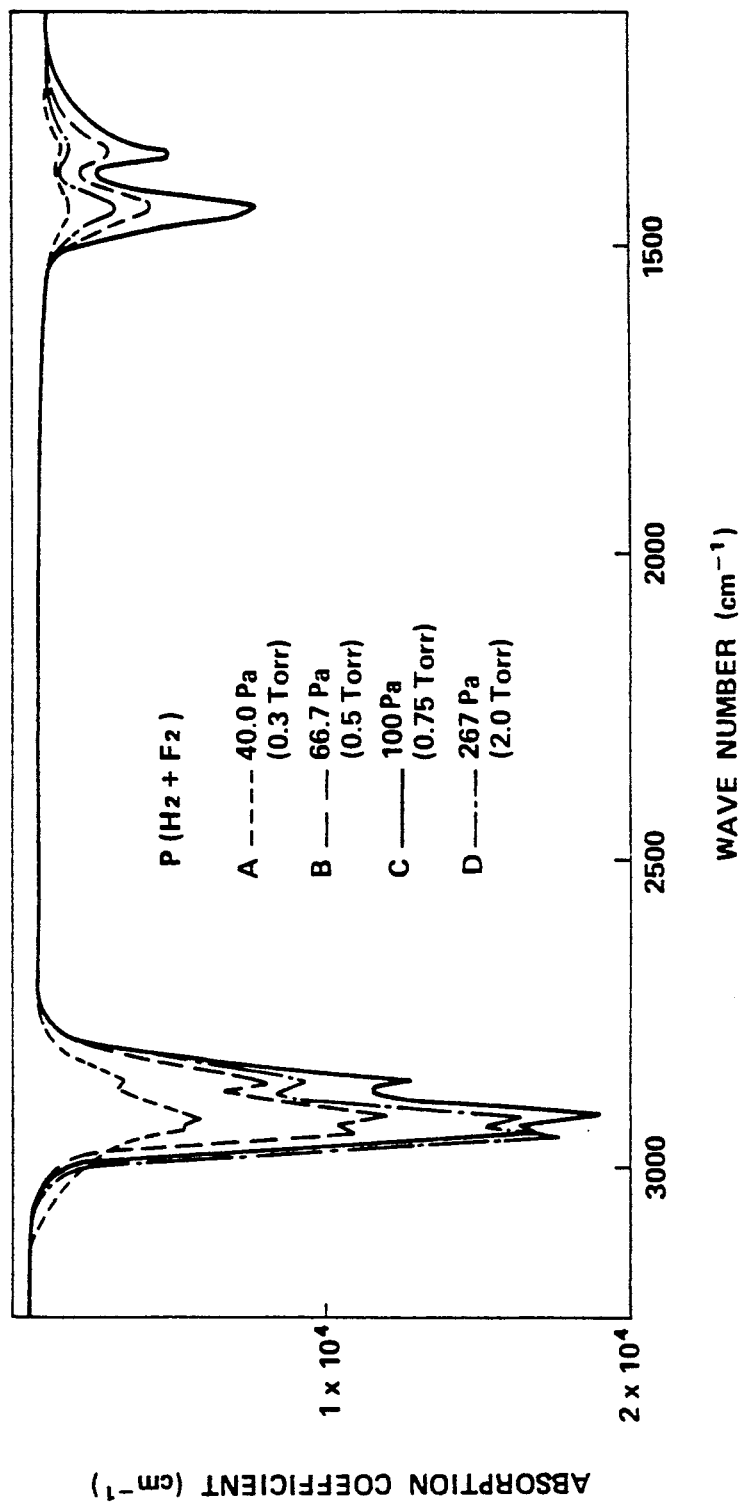

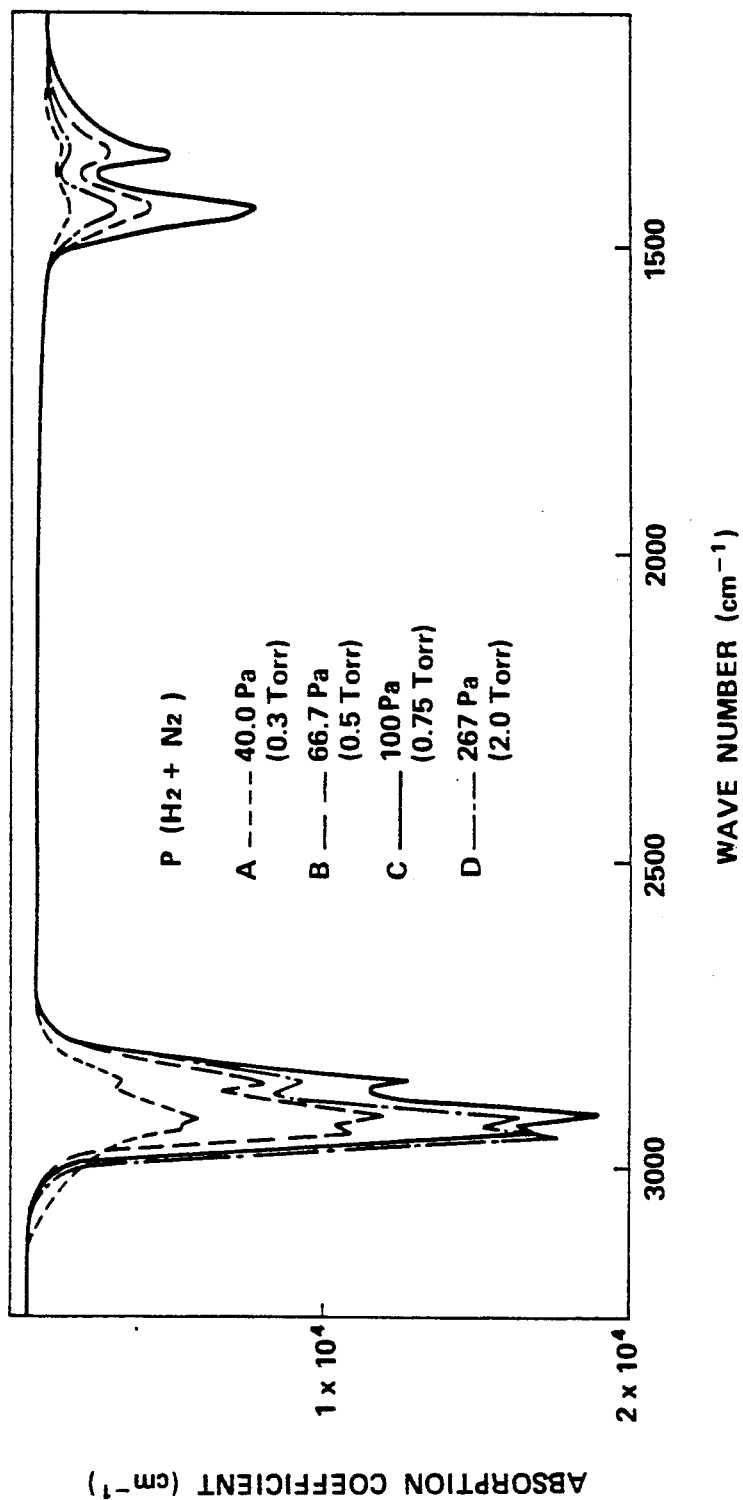

METHOD FOR CARBON FILM PRODUCTION

BACKGROUND OF THE INVENTION

This invention relates to a method of producing a carbon film on a substrate and, more particularly, to a carbon film producing method utilizing a reactive sputtering process for releasing carbon particles from a graphite target electrode to deposit a carbon film on a substrate.

It is the conventional practice to produce carbon films in diamond or amorphous formation on substrates by utilizing an ion beam method or a plasma CVD method. According to such an ion beam method, carbon films are produced by ionizing a carbon source in a vacuum, accelerating the resulting ions in an electrostatic manner, and bombarding a target substrate with the accelerated ions. Therefore, the ion beam method requires a large-sized ion accelerator and has a tendency to produce structural failures in the carbon layer caused by bombardment with ion beams on the substrate. In addition, the ion beam method is not applicable for organic substrates, semiconductive substrates or other materials which would be damaged by bombardment with ion beams. The plasma CVD method utilizes a plasma to decompose hydrocarbon gas (carbon source) into carbon atomic particles. However, in the plasma CVD method there is a tendency for re-polymerization to occur causing production of various kinds of growth nuclide. Therefore, it is very difficult to produce carbon films having desired characteristics. In addition, the plasma CVD method requires the substrate temperature to be maintained above 200° C. Therefore, this method is not applicable to substrates which cannot tolerate such high temperatures.

SUMMARY OF THE INVENTION

Therefore, it is a main object of the invention to provide an improved carbon film producing method which can produce carbon films having desired characteristics.

It is another object of the invention to provide an improved carbon film producing method which can produce carbon films at a relatively low temperature.

There is provided, in accordance with the invention, a method of producing a carbon film on a substrate. The method comprises the steps of placing the substrate in a vacuum chamber having a graphite target electrode and an opposite electrode placed therein, evacuating the vacuum chamber to a predetermined pressure, introducing a gaseous mixture into the vacuum chamber to produce a gaseous atmosphere therein at a pressure ranging from 0.7 Pa to 665 Pa, the gaseous mixture includes a kind of gas mixed at a predetermined ratio to hydrogen gas, and releasing atomic particles from the graphite target electrode through a reactive sputtering process performed in the gaseous atmosphere, thereby depositing a carbon film on the substrate.

BRIEF DESCRIPTION OF THE DRAWINGS

This invention will be described in greater detail by reference to the following description taken in connection with the accompanying drawings, in which:

FIG. 3 is a graph showing the effect of mixed gas pressure $P(B_2H_6+H_2)$ on carbon film specific resistance;

FIG. 10 is a graph showing the effect of mixed gas pressure $P(F_2+H_2)$ on carbon film infrared spectrum;

FIG. 14 is a graph showing the effect of mixed gas pressure $P(N_2+H_2)$ on carbon film infrared ray spectrum;

DETAILED DESCRIPTION OF THE INVENTION

Figure 1:
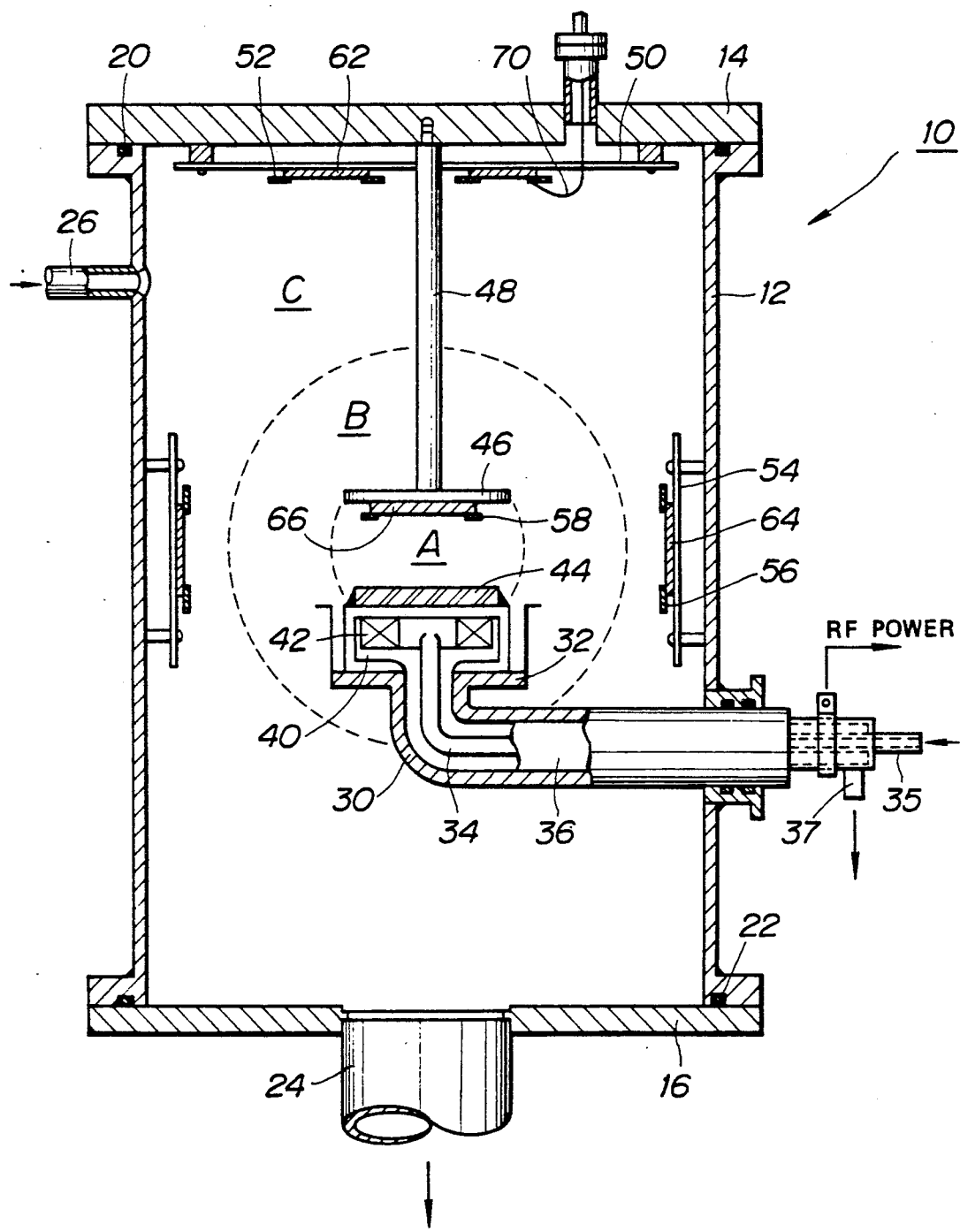
FIG. 1 is a sectional view showing a sputtering device used in the inventive method.

Referring to the drawings and more particularly to FIG. 1, there is illustrated a sputtering device for use in producing carbon films on glass, quartz, or similar materials according to the method of the invention. The sputtering device includes a vacuum vessel, designated generally by the numeral 10, which includes a cylindrical metal body 12 closed at its opposite ends with upper and lower metal covers 14 and 16 to define a vacuum chamber therein. An O-ring 20 is provided to prevent leakage between the upper cover 14 and the cylindrical body upper end. Similarly, an O-ring 22 is provided to prevent leakage between the lower cover 16 and the cylindrical body lower end. The lower cover 16 is formed centrally with an opening through which an exhaust pipe 24 opens into the vacuum chamber. The exhaust pipe 24 is connected to a vacuum pump (not shown) which is operable to evacuate the vacuum chamber and keep it at a high vacuum. A gas mixture is introduced through a gas inlet pipe 26 to provide an atmosphere of the gas mixture in the vacuum chamber. The gas inlet pipe 26 extends through the cylindrical body wall at a position near the upper cover 14.

A coolant pipe 30 extends through the cylindrical body 12 into the vacuum chamber and terminates in an upward facing flange 32 on which an electrode box 40 is placed. A seal is provided to prevent leakage between the coolant pipe 30 and the cylindrical body wall. The electrode box 40 has a magnetron 42 including a permanent magnet placed therein and a graphite target or cathode electrode 44 supported thereon. The magnetron 40 is operable to create a magnetic field. The coolant pipe 30 has a coolant supply pipe 34 extending inside the coolant pipe 30 from a coolant inlet port 35 into the electrode box 40, and a coolant discharge pipe 36 defined outside the coolant supply pipe 34. The coolant discharge pipe 36 extends from the electrode box 40 to a coolant discharge port 37. The coolant inlet port 35 is connected to a pump (not shown) which is operable to introduce a coolant, such for example as water, through the coolant supply pipe 34 for cooling the magnetron 42 and graphite target electrode 44. The coolant is discharged from the electrode box 40 through the coolant discharge pipe 36 to the coolant discharge port 37. An anode or opposite electrode 46, which is secured and grounded through a conductive rod 48 to the upper cover 14, is positioned in a parallel-spaced relation to the graphite target electrode 44. The target electrode 44 is electrically connected to an RF power source (not shown) through the electrode box 40 and the coolant pipe 30.

A support plate 50, insulated electrically from the ground potential, is secured on the inner surface of the upper cover 14. The support plate 50 is shown as having two glass substrates 62 fixed thereon by the aid of retainers 52. Another support plate 54, insulated electrically from the ground potential, is secured on the inner surface of the cylindrical body 12. The support plate 54 is shown as having two glass substrate 64 secured thereon by the aid of retainers 56. Another glass substrate 66 is fixed on the opposite electrode 46 by the aid of retainers 58. The reference numeral 70 designates a thermocouple for measuring the temperature of the glass substrate 62. Similar thermocouples may be provided for measuring the temperatures of the other glass substrates.

In operation, after the vacuum chamber is evacuated to a predetermined pressure, a gas mixture is introduced through the gas inlet pipe 26 to produce a gaseous atmosphere at a predetermined pressure in the vacuum chamber. Following this, a sputtering operation is started by applying a high-frequency (radio frequency) power between the target and opposite electrodes 44 and 46. During the sputtering operation, a plasma is generated in the domain A indicated by an inner broken circle between the electrodes 44 and 46 to release carbon atomic particles from the graphite target electrode 44. The released atomic particles pass through the domain B indicated by an outer broken circle to the domain C where they are deposit themselves relatively softly in the form of a carbon film having diamond or amorphous formation on the glass substrates 62 and 64 placed in the domain C outside the domain B. It is to be noted that, since most of the atomic particles that pass into the domain C, are charged particles and therefore subjective to the influence of electric fields, the substrates 62 and 64 should be located at positions having a uniform potential, such as near a ground potential for example.

The following Examples further specifically describe advantageous characteristics carbon films produced according to the method of the invention.

EXAMPLE 1

The vacuum chamber was evacuated to a pressure of $1.33 \times 10^{-5}$ Pa ($10^{-7}$ Torr) and then a diborane ($B_2H_6$) and hydrogen ($H_2$) gas mixture having a mixing ratio ($B_2H_6/H_2$) of 10 ppm was introduced through the gas inlet pipe 26 into the vacuum chamber until the vacuum chamber pressure increased to 67 Pa (0.5 Torr). After the vacuum chamber pressure became stable, a sputtering operation was started by supplying a power having a frequency of 13.56 MHz to the target electrode 44. The sputtering operation was continued for 9 hours while controlling the high-frequency current in such a manner as to produce an electric power of 6.8 W/cm$^2$ at the graphite target electrode 44. As a result, light-yellow or colorless, transparent carbon films were produced on the respective glass substrates 62, 64 and 66.

During the sputtering operation, the temperatures of the glass substrates 62, 64 and 66 were 80° C. or less, 80° C. or less, 180° C., respectively. This indicates that the sputtering can be made under low temperature if the glass substrates are placed on the domain C. The forces of adhesion of the carbon films to the respective glass substrates were tested by applying and then exfoliating an adhesive tape on each of the carbon films. None of the carbon films became separated from the respective glass substrates. In the exfoliation tests, the adhesion of the carbon films produced on the glass substrate 66 proved to be superior to that of the carbon films produced on the other glass substrates 62 and 64. The carbon films produced on the glass substrate 62 exhibited a specific electrical resistance greater than $1 \times 10^{12}$ $\Omega$·cm, the carbon films produced on the glass substrate 64 exhibited a specific resistance greater than $1 \times 10^{12}$ $\Omega$·cm, and the carbon films produced on the glass substrate 66 exhibited a specific resistance of $1 \times 10^{11}$ $\Omega$·cm. Carbon films were produced by the sputtering method under the same conditions except that only hydrogen gas was introduced to produce an atmosphere of hydrogen in the vacuum chamber. The carbon films produced on the glass substrate 62 exhibited a specific resistance of $1 \times 10^{11}$ $\Omega$·cm or more, the carbon films produced on the glass substrate 64 exhibited a specific resistance of $1 \times 10^{11}$ $\Omega$·cm or more, and the carbon films produced on the glass substrate 66 exhibited a specific resistance of $6 \times 10^{10}$ $\Omega$·cm. It can be seen that the carbon films produced in an atmosphere of diborane and hydrogen have a higher specific resistance than the carbon films produced in an atmosphere of hydrogen only.

Figure 2:
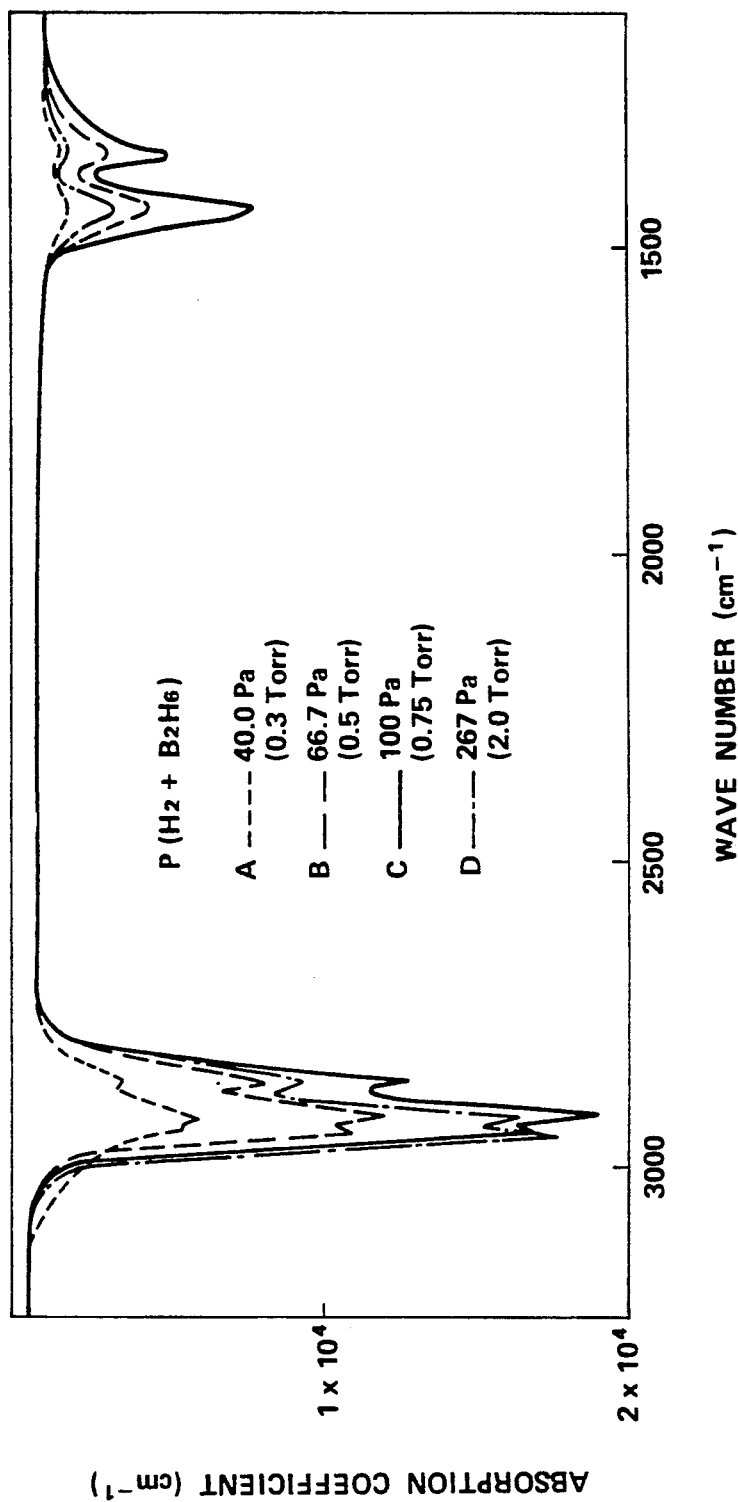
FIG. 2 is a graph showing the effect of mixed gas pressure $P(B_2H_6+H_2)$ on carbon film infrared spectrum.

FIG. 2 illustrates the results of a series of spectral analysis tests which were conducted to show the effect of mixed gas pressure $P(B_2H_6+H_2)$, $B_2H_6/H_2=10$ ppm, on carbon films absorption in the infrared spectrum. Curve A illustrates carbon films produced at a mixed gas pressure of 40.0 Pa (0.3 Torr), curve B illustrates carbon films produced at a mixed gas pressure of 66.7 Pa (0.5 Torr), curve C illustrates carbon films produced at a mixed gas pressure of 100 Pa (0.75 Torr), and curve D illustrates carbon films produced at a mixed gas pressure of 267 Pa (2.0 Torr). The test results have proved to be substantially similar to the results of tests conducted on carbon films produced under the same conditions except that only hydrogen gas was introduced to provide a gaseous atmosphere in the vacuum chamber.

FIG. 3 illustrates the results of a number of tests which were conducted at different mixed gas pressures including 1.33 Pa (0.01 Torr), 6.67 Pa (0.05 Torr), 13.3 Pa (0.1 Torr), 40.0 Pa (0.3 Torr), 100 Pa (0.75 Torr), 133 Pa (1.0 Torr), 200 Pa (1.5 Torr) and 267 Pa (2.0 Torr) to show the effect of mixed gas pressure $P(H_2+B_2H_6)$, $B_2H_6/H_2=10$ ppm, on carbon film specific resistance. It is apparent from FIG. 3 that the carbon films produced by the method of the invention have high resistances. This would indicate that the carbon films are composed mostly of $SP^3$ couplings and they have fewer of the low resistance $SP^2$ couplings.

Figure 4:
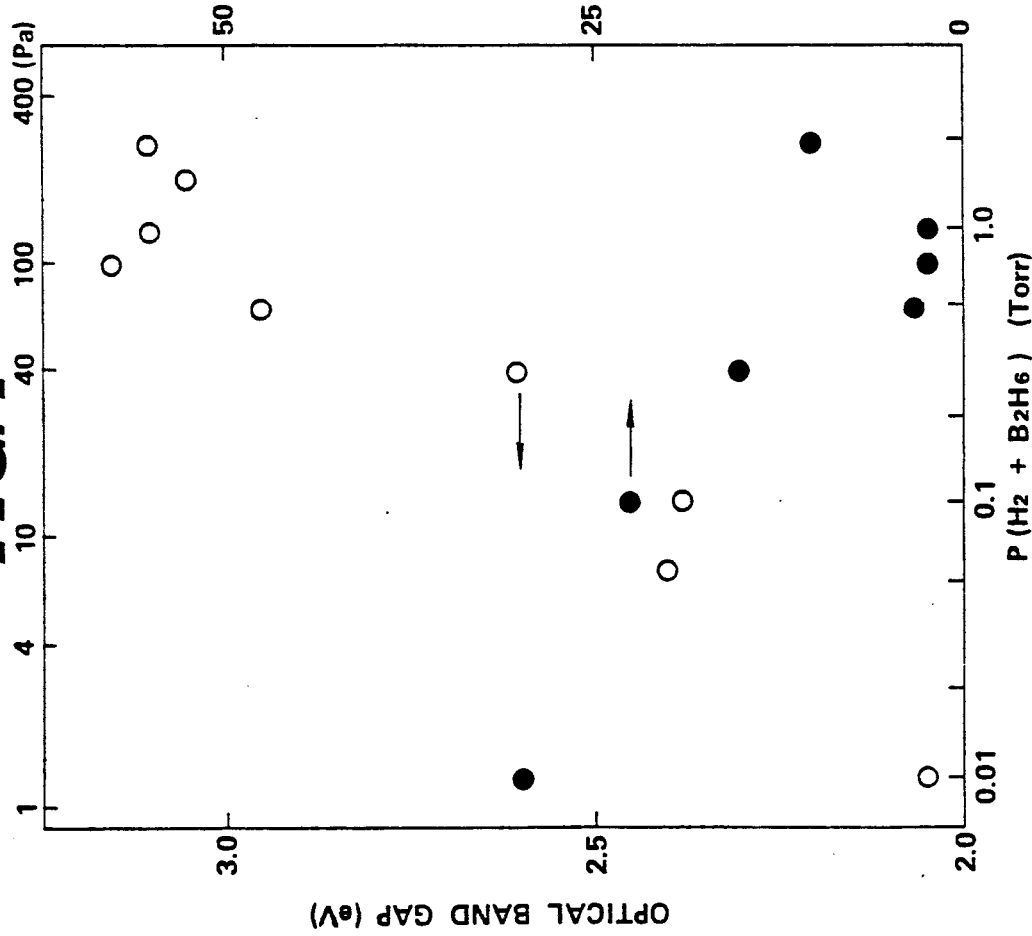
FIG. 4 is a graph showing the effect of mixed gas pressure $P(B_2H_6+H_2)$ on carbon film optical band gap and spin density.

FIG. 4 illustrates the results of a series of tests which were conducted to show the effect of mixed gas pressure $P(H_2 30\ B_2H_6)$, $B_2H_6/H_2=10$ ppm on carbon film optical band-gap and spin density. The white points indicate optical band-gap values plotted with respect to given values of mixed gas pressure and the black points indicate spin density values plotted with respect to given values of mixed gas pressure. It is apparent from FIG. 4 that the carbon films produced according to the method of the invention have a good optical band-gap ranging from 2.05 to 3.15 eV and a small spin density ranging from $2\times10^{16}$ to $3\times10^{17}/cm^3$. It is, therefore, possible to provide a semiconductor having a desired characteristic by doping small quantities of impurities to the carbon film.

Figure 5:
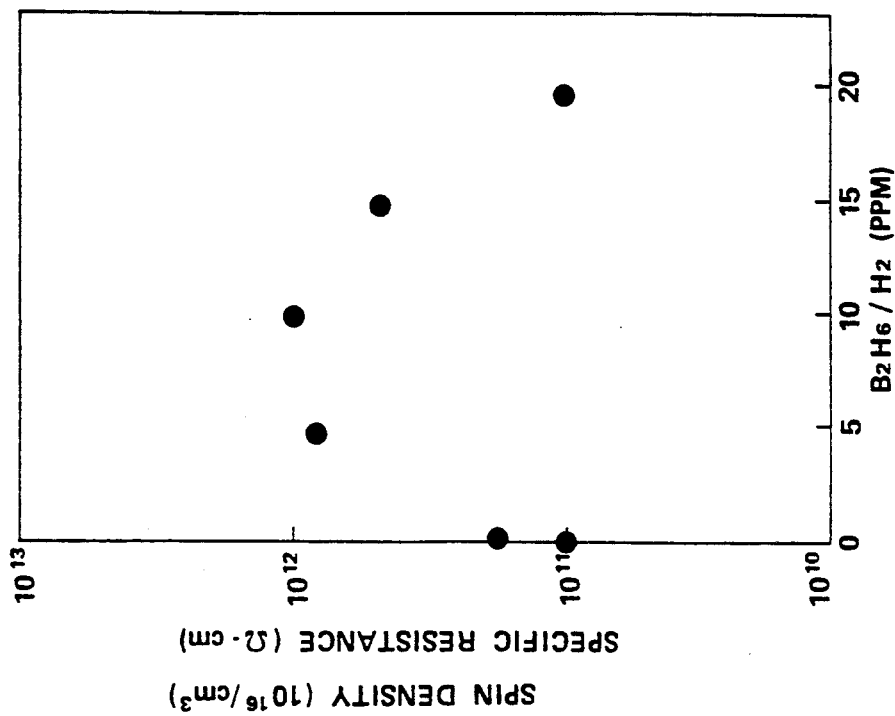
FIG. 5 is a graph showing the effect of gas mixing ratio $(B_2H_6/H_2)$ on carbon film specific resistance.

FIG. 5 illustrates the results of a number of further tests which were conducted to show the effect of gas mixing ratio ($B_2H_6/H_2$) on carbon film specific resistance. In these tests, the gas mixing ratio was changed in a range from 1 to 20 ppm while the mixed gas pressure was held at 66.7 Pa. The gas mixing ratio ranging from 1 to 20 ppm has proven satisfactory. If the gas mixing ratio is smaller than this range, the carbon film specific resistance becomes too small. If it is greater than he range, the semiconductor effect will decrease the carbon film specific resistance to a level that is less than the specific resistance of carbon films produced by the sputtering method in an atmosphere of hydrogen only.

It is preferable that the diborane and hydrogen gas mixture be held at a pressure ranging from 0.7 Pa to 665 Pa (5 Torr). If the mixed gas pressure is smaller than this range, the carbon films will exhibit a low specific resistance and an undesirable spin density. If it is greater than the range, the infrared spectrum will have a greater absorption coefficient at a 2960 cm$^{-1}$ wave number, as shown in FIG. 2, causing a film quantity change and a spin density increase.

EXAMPLE 2

The vacuum chamber was evacuated to a pressure of $1.33\times10^{-5}$ Pa ($10^{-7}$ Torr) and then a oxygen ($O_2$) and hydrogen ($H_2$) gas mixture having a mixing ratio ($O_2/H_2$) of 25 ppm was introduced through the gas inlet pipe 26 into the vacuum chamber until the vacuum chamber pressure increased to 67 Pa (0.5 Torr). After the vacuum chamber pressure became stable, a sputtering operation as started by supplying a high-frequency power having a frequency of 13.56 MHz to the target electrode 44. The sputtering operation was continued for 9 hours while controlling the high-frequency current in a manner to produce an electric power of 6.8 W/cm$^2$ for the graphite target electrode 44. As a result, light-yellow or colorless, transparent carbon films were produced on the respective glass substrates 62, 64 an 66.

During the sputtering operation, the temperatures of the glass substrates 62, 64 and 66 were 80° C. or less 80° C. or less, 180° C., respectively. This indicated that the sputtering operation can be performed at a relatively low temperature if the glass substrates are placed in domain C. The forces of adhesion of the carbon films to the respective glass substrates were tested by applying and exfoliating an adhesive tape on each carbon films. None of the carbon films became separated from the respective glass substrates. In the exfoliation tests, the carbon films produced on the glass substrate 66 proved to be superior to the carbon films produced on the other glass substrates 62 and 64. The carbon films produced on the glass substrate 62 exhibited a specific resistance greater than $1\times10^{12}$ Ω·cm, the carbon films produced on the glass substrate 64 exhibited a specific resistance greater than $1\times10^{12}$ Ω·cm, and the carbon films produced on the glass substrate 66 exhibited a specific electrical resistance of $1\times10^{11}$ Ω·cm. Carbon films were produced by the sputtering method under the same conditions except that only hydrogen gas was introduced to produce an atmosphere of hydrogen in the vacuum chamber. The carbon films produced on the glass substrate 62 exhibited a specific resistance of $1\times10^{11}$ Ω·cm or more, the carbon films produced on the glass substrate 64 exhibited a specific resistance of $1\times10^{11}$ Ω·cm or more, and the carbon films produced on the glass substrate 66 exhibited a specific resistance of $6\times10^{10}$ Ω·cm. It can be seen that the carbon films produced in an atmosphere of oxygen and hydrogen have a higher specific resistance than the carbon films produced in an atmosphere of hydrogen only.

Figure 6:
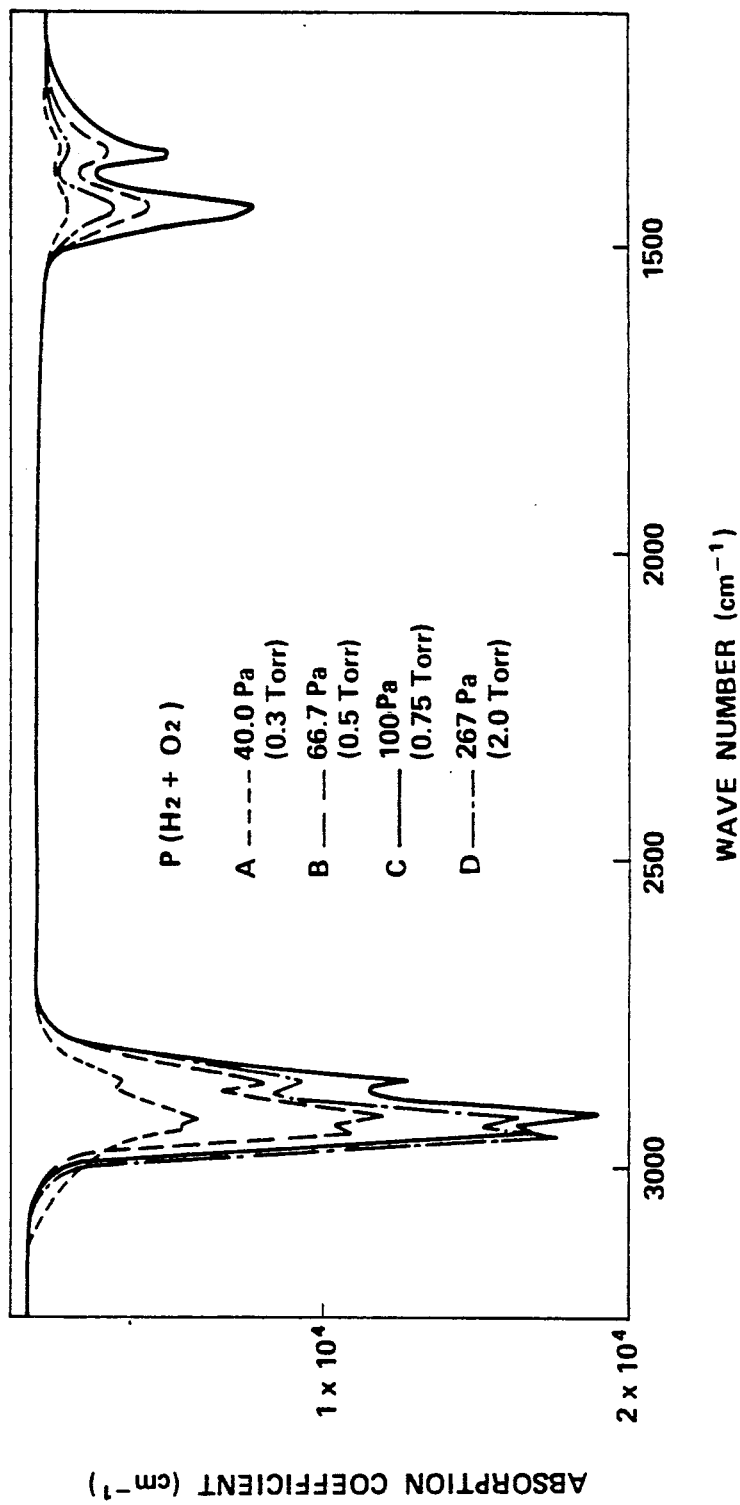
FIG. 6 is a graph showing the effect of mixed gas pressure $P(O_2+H_2)$ on carbon film infrared spectrum.

FIG. 6 illustrates the results of a series of tests which were conducted to show the effect of mixed gas pressure $P(O_2+H_2)$, $O_2/H_2=25$ ppm, on carbon film infrared spectrum. Curve A illustrates carbon films produced at a mixed gas pressure of 40.0 Pa (0.3 Torr), curve B illustrates carbon films produced at a mixed gas pressure of 66.7 Pa (0.5 Torr), curve C illustrates carbon films produced at a mixed gas pressure of 100 Pa (0.75 Torr), and curve D illustrates carbon films produced at a mixed gas pressure of 267 Pa (2.0 Torr). These test results have proven substantially similar to the results of tests conducted on carbon films produced under the same conditions except that only hydrogen gas was introduced to provide a gaseous atmosphere in the vacuum chamber.

Figure 7:
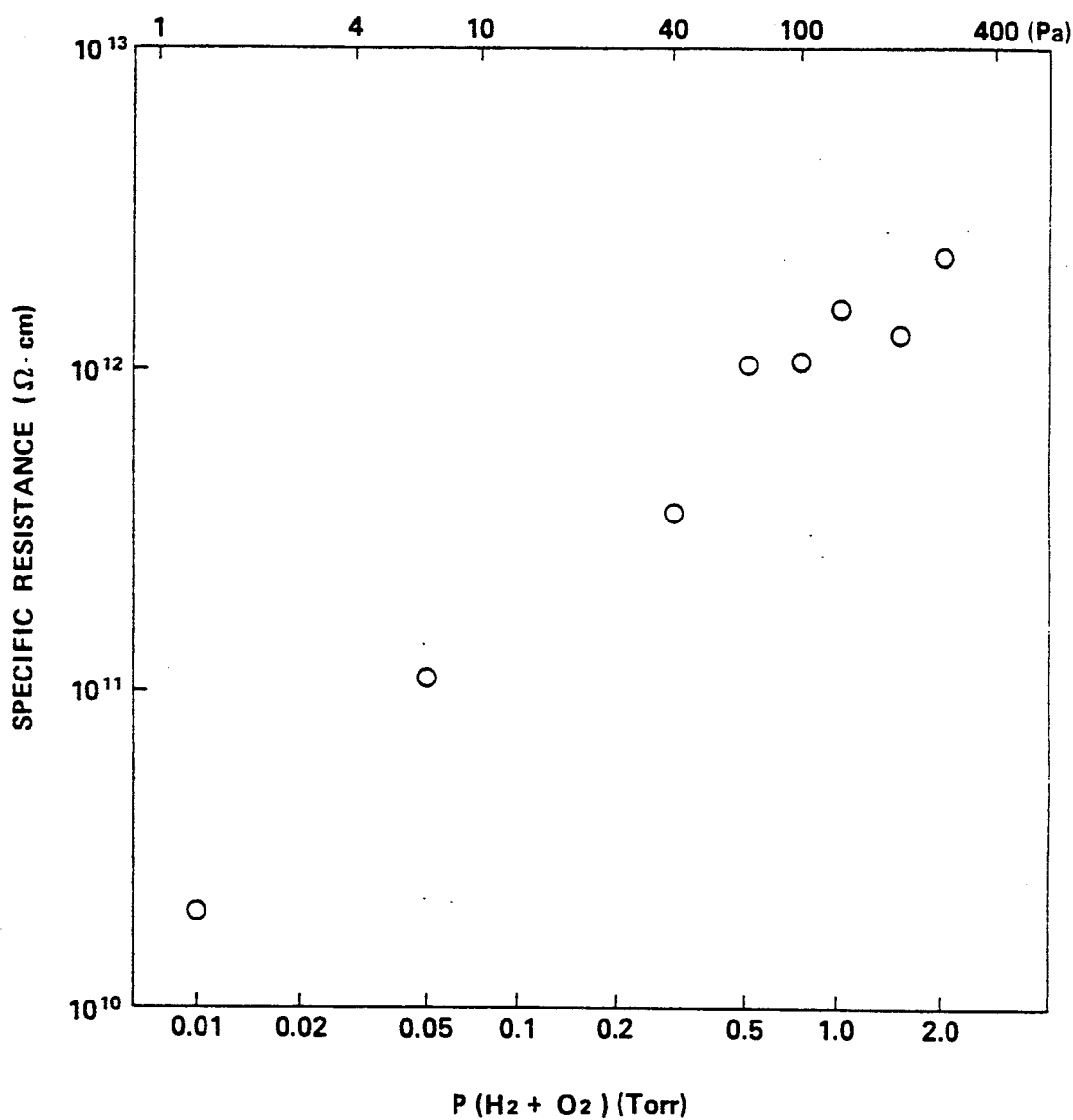
FIG. 7 is a graph showing the effect of mixed gas pressure $P(O_2+H_2)$ on carbon film specific resistance.

FIG. 7 illustrates the results of a number of tests which were conducted at different mixed gas pressures including 1.33 Pa (0.01 Torr), 6.67 Pa (0.05 Torr), 13.3 Pa (0.1 Torr), 40.0 Pa (0.3 Torr), 100 Pa (0.75 Torr), 133 Pa (1.0 Torr), 200 Pa (1.5 Torr) and 267 Pa (2.0 Torr) to show the effect of mixed gas pressure $P(H_2+O_2)$, $O_2/H_2=25$ ppm, on carbon film specific resistance. It is apparent from FIG. 7 that the carbon films produced by the method of the invention have high resistances. This corresponds to the fact that the carbon films are mostly composed of $SP^3$ couplings and they have fewer of the lower resistance $SP^2$ couplings.

Figure 8:
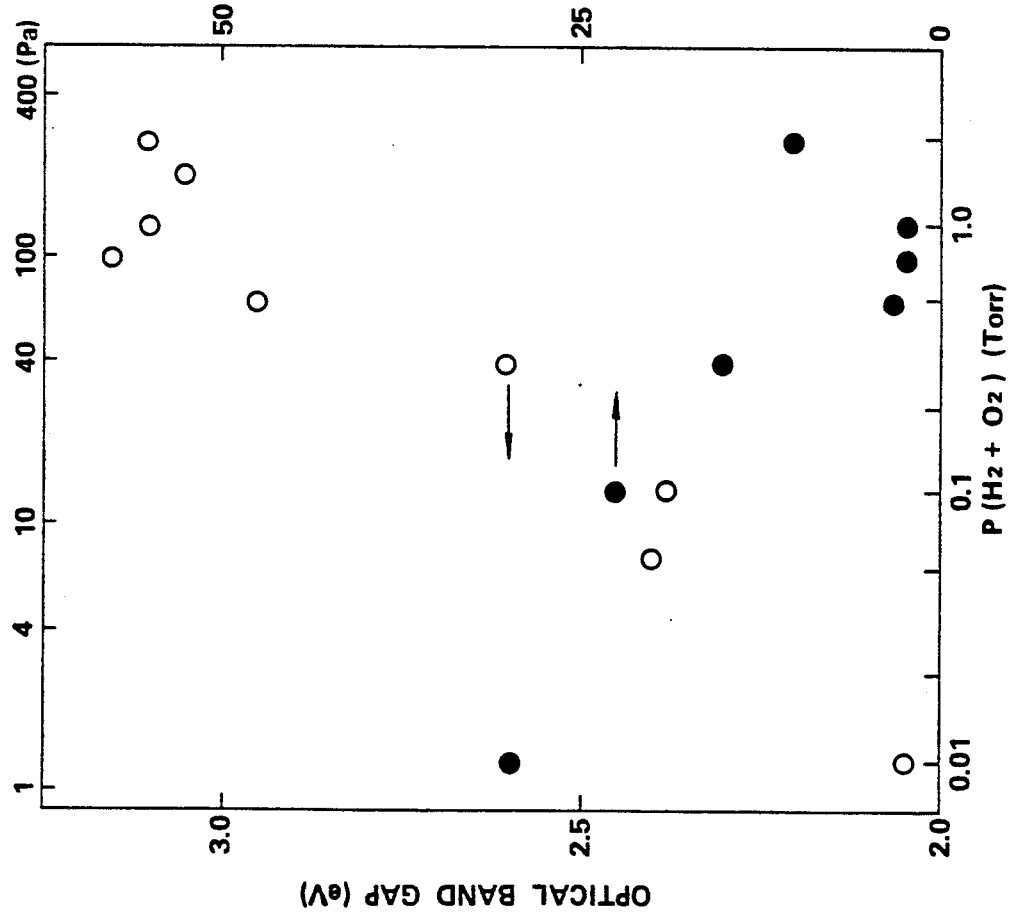
FIG. 8 is a graph showing the effect of mixed gas pressure $P(O_2+H_2)$ on carbon film optical band gap and spin density.

FIG. 8 illustrates the results of a series of tests which were conducted to show the effect of mixed gas pressure $P(H_2+O_2)$, $O_2/H_2=25$ ppm, on carbon film optical band-gap and spin density. The white points indicate optical band-gap values plotted with respect to given values of mixed gas pressure and the black points indicate spin density values plotted with respect to given values of mixed gas pressure. It is apparent from FIG. 8 that the carbon film produced according to the method of the invention has a good optical band-gap ranging from 2.05 to 3.15 eV and a small spin density ranging from $2\times10^{16}$ to $3\times10^{17}$/cm$^3$. It is, therefore, possible to provide a semiconductor having a desired characteristic by doping small quantities of impurities to the carbon film.

Figure 9:
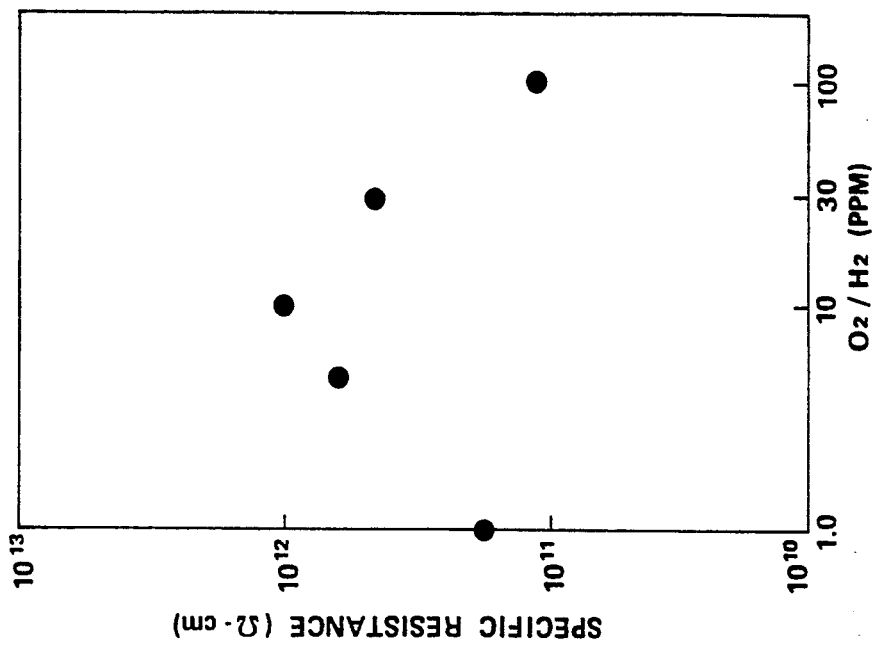
FIG. 9 is a graph showing the effect of gas mixing ratio $(O_2/H_2)$ on carbon film specific resistance.

FIG. 9 illustrates the results of a number of further tests which were conducted to show the effect of gas mixing ratio ($O_2/H_2$) on carbon film specific resistance. In these tests, the gas mixing ratio was varied through a range from 1 to 100 ppm has proven satisfactory. If the gas mixing ratio is smaller than this range, the carbon film specific resistance is too small. If it is greater than the range, the carbon film specific resistance will decrease to a level less than the specific resistance of carbon films produced by the sputtering method in a hydrogen only atmosphere.

It is preferable that the oxygen and hydrogen gases mixture be held at a pressure ranging from 0.7 Pa to 665 Pa (5 Torr). If the mixed gas pressure is smaller than this range, the carbon films will exhibit a low specific resistance and an undesirable spin density. If it is greater than the range, the infrared spectrum will have a greater absorption coefficient at a 2960 cm$^{-1}$ wave number, as shown in FIG. 6, causing a film quantity change and a spin density increase.

EXAMPLE 3

The vacuum chamber was evacuated to a pressure of $1.33\times10^{-5}$ Pa ($10^{-7}$ Torr) and then fluorine ($F_2$) and hydrogen ($H_2$) gases mixed at a mixing ratio ($F_2/H_2$) of 10 ppm was introduced through the gas inlet pipe 26 into the vacuum chamber until the vacuum chamber pressure increases to 67 Pa (0.5 Torr). After the vacuum chamber pressure became stable, a sputtering operation as started by supplying a high-frequency power having a frequency of 13.56 MHz to the target electrode 44. The sputtering operation as continued for 9 hours while controlling the high-frequency current in a manner to produce an electric power of 6.8 W/cm$^2$ at the graphite target electrode 44. As a result, light-yellow or colorless, transparent carbon films were produced on the respective glass substrates 62, 64 and 66.

During the sputtering operation, the temperatures of the glass substrates 62, 64 and 66 were 80° C. or less, 80° C. or less, 180° C., respectively. This indicates that the sputtering can be made under low temperature if the glass substrates are placed on the domain C. The forces of adhesion of the carbon films to the respective glass substrates were tested by applying and exfoliating an adhesive tape on each carbon films. None of the carbon films were separated from the respective glass substrates. In the exfoliation tests, the carbon films produced on the glass substrate 66 has proven superior to the carbon films produced on the other glass substrates 62 and 64. The carbon films produced on the glass substrate 62 exhibited a specific resistance greater than $1\times10^{12}$ Ω·cm, the carbon films produced on the glass substrate 64 exhibited a specific resistance greater than $1\times10^{12}$ Ω·cm, and the carbon films produced on the glass substrate 66 exhibited a specific resistance of $1\times10^{11}$ Ω·cm. Carbon films were produced by the sputtering method under the same conditions except that only hydrogen gas was introduced to produce an atmosphere of hydrogen in the vacuum chamber. The carbon films produced on the glass substrate 62 exhibited a specific resistance of $1\times10^{11}$ Ω·cm or more, the carbon films produced on the glass substrate 64 exhibited a specific resistance of $1\times10^{11}$ Ω·cm or more, and the carbon films produced on the glass substrate 66 exhibited a specific resistance of $6\times10^{10}$ Ω·cm. It can be seen that the carbon films produced in an atmosphere of fluorine and hydrogen have a higher specific resistance than the carbon films produced in an atmosphere of hydrogen only.

FIG. 10 illustrates the results of a series of tests which were conducted to show the effect of mixed gas pressure $P(F_2+H_2)$, $F_2/H_2=10$ ppm, on carbon film infrared spectrum. Curve A illustrates carbon films produced at a mixed gas pressure of 40.0 Pa (0.3 Torr), curve B illustrates carbon films produced at a mixed gas pressure of 66.7 Pa (0.5 Torr), curve C illustrates carbon films produced at a mixed gas pressure of 100 Pa (0.75 Torr), and curve D illustrates carbon films produced at a mixed gas pressure of 267 Pa (2.0 Torr). These test results have proven substantially similar to the results of tests conducted for carbon films produced under the same conditions except that only hydrogen gas was introduced to provide a gaseous atmosphere in the vacuum chamber.

Figure 11:
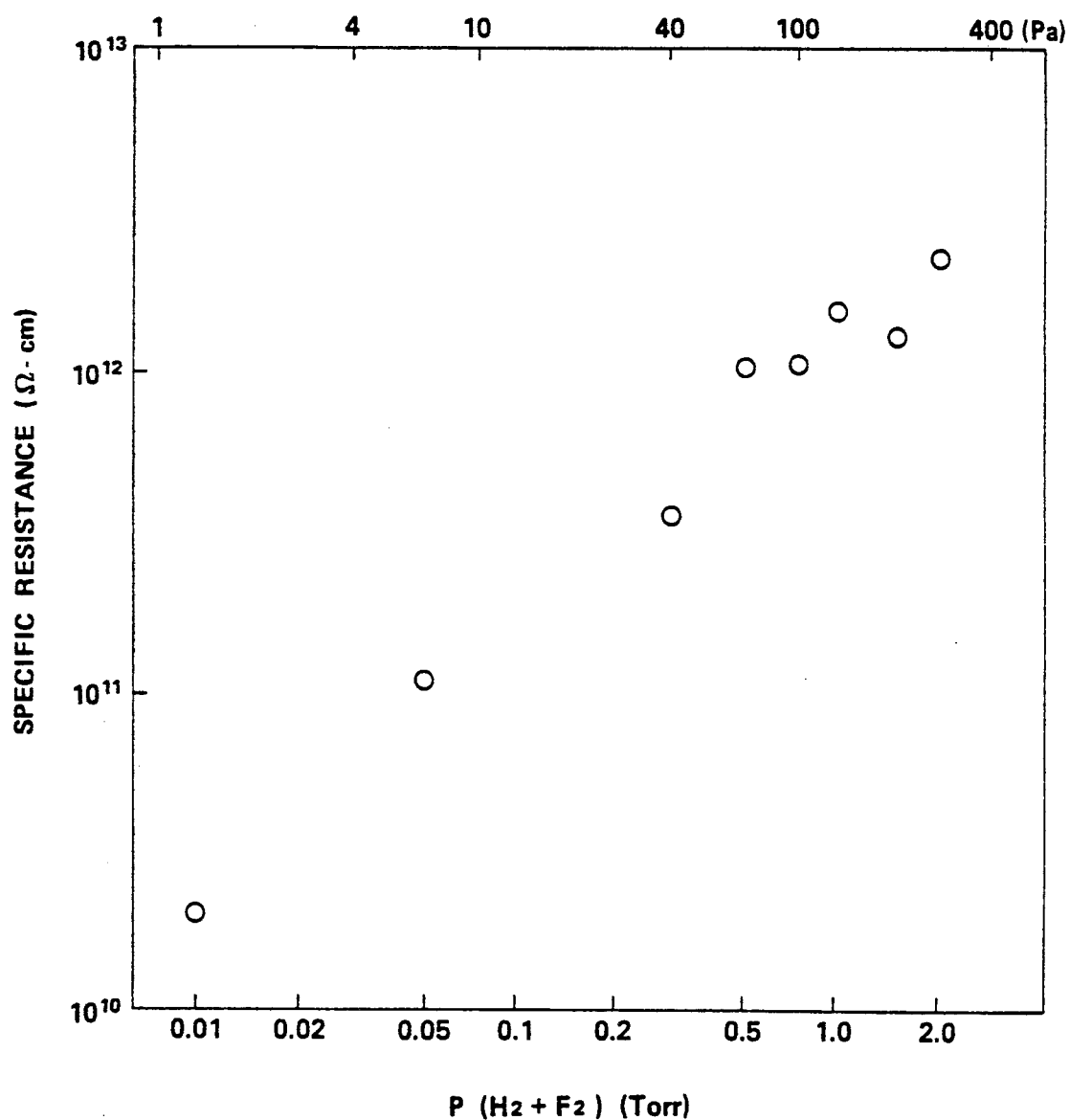
FIG. 11 is a graph showing the effect of mixed gas pressure $P(F_2+H_2)$ on carbon film specific resistance.

FIG. 11 illustrates the results of a number of tests which were conducted at different mixed gas pressures including 1.33 Pa (0.01 Torr), 6.67 Pa (0.05 Torr), 13.3 Pa (0.1 Torr), 40.0 Pa (0.3 Torr), 100 Pa (0.75 Torr), 133 Pa (1.0 Torr), 200 Pa (1.5 Torr) and 267 Pa (2.0 Torr) to show the effect of mixed gas pressure $P(F_2+H_2)$, $F_2/H_2=10$ ppm, on carbon film specific resistance. It is apparent from FIG. 11 that the carbon films produced by the method of the invention have high resistances. This corresponds to the fact that the carbon films are composed almost of SP$^3$ couplings and they have less SP$^2$ couplings which cause insulation resistance reduction.

Figure 12:
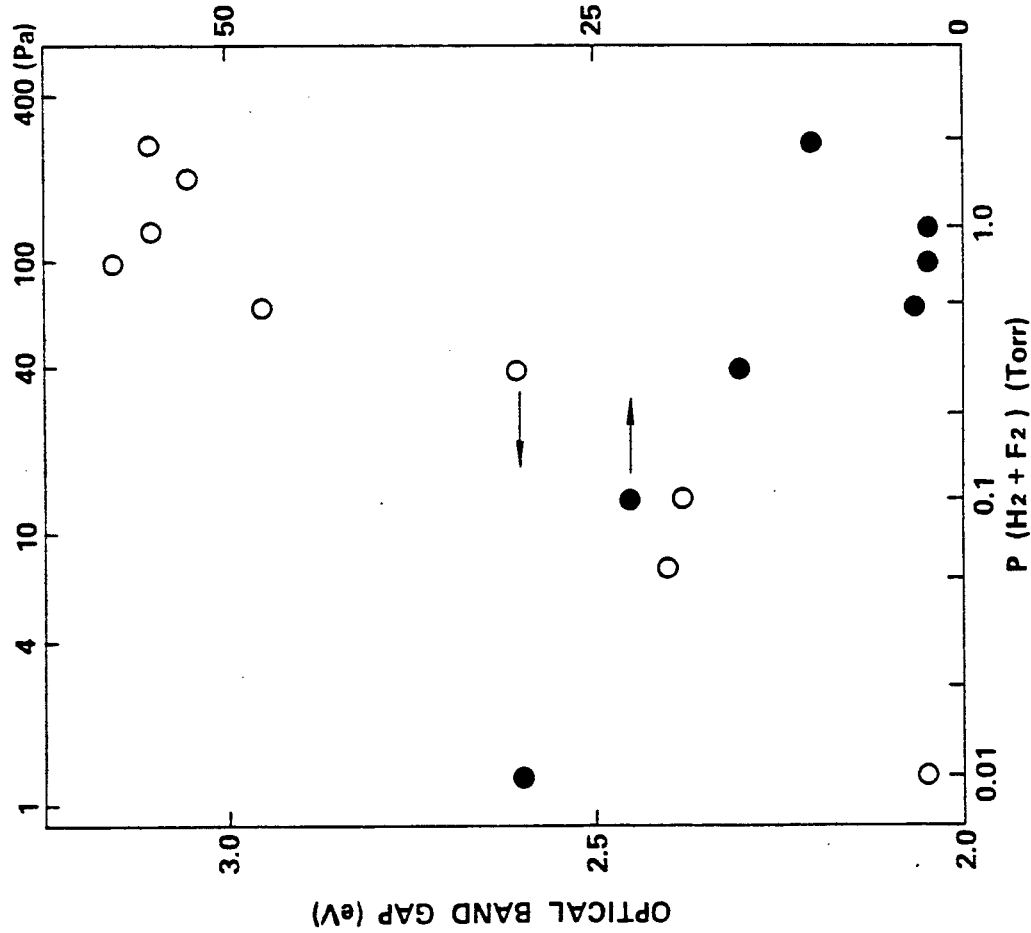
FIG. 12 is a graph showing the effect of mixed gas pressure $P(F_2+H_2)$ on carbon film optical band gap and spin density.

FIG. 12 illustrates the results of a series of tests which were conducted to show the effect of mixed gas pressure $P(F_2+H_2)$, $F_2/H_2=10$ ppm, on carbon film optical band-gap and spin density. The white points indicate optical band-gap values plotted with respect to given values of mixed gas pressure and the black points indicate spin density values plotted with respect to given values of mixed gas pressure. It is apparent from FIG. 12 that the carbon film produced according to the method of the invention has a good optical band-gap ranging from 2.05 to 3.15 eV and a small spin density ranging from $2\times10^{16}$ to $3\times10^{17}$/cm$^3$. It is, therefore, possible to provide a semiconductor having a desired characteristic by doping small quantities of impurities to the carbon film.

Figure 13:
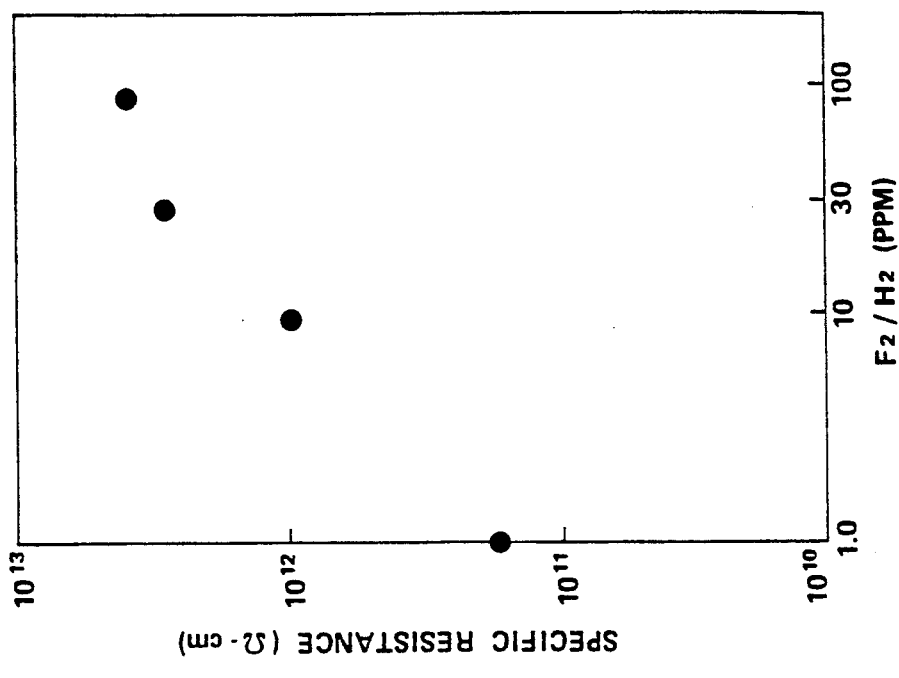
FIG. 13 is a graph showing the effect of gas mixing ratio $(F_2/H_2)$ on carbon film specific resistance.

FIG. 13 illustrates the results of a number of further tests which were conducted to show the effect of gas mixing ratio ($F_2/H_2$) on carbon film specific resistance. In these tests, the gas mixing ratio was changed in a range from 1 to 100 ppm while the mixed gas pressure was held at 66.7 Pa. The gas mixing ratio ranging from 1 to 100 ppm has proven satisfactory. If the gas mixing ratio is smaller than this range, the carbon film specific resistance is too small. If it is greater than the range, there will be a greater tendency of the fluorine gas to corrode the vacuum vessel 10 made of SUS304 or SUS316.

It is preferable that the fluorine and hydrogen gas mixture be held at a pressure ranging from 0.7 Pa to 665 Pa (5 Torr). If the mixed gas pressure is smaller than this range, the carbon films will exhibit a low specific resistance and an undesirable spin density. If it is greater than the range, the infrared spectrum will have a greater absorption coefficient at a 2960 cm$^{-1}$ wave number, as shown in FIG. 10, causing a film quantity change and a spin density increase.

EXAMPLE 4

The vacuum chamber was evacuated to a pressure of $1.33 \times 10^{-5}$ Pa ($10^{-7}$ Torr) and then nitrogen ($N_2$) and hydrogen ($H_2$) gases mixed at a mixing ratio ($N_2/H_2$) of 25 ppm was introduced through the gas inlet pipe 26 into the vacuum chamber until the vacuum chamber pressure increases to 67 Pa (0.5 Torr). After the vacuum chamber pressure came into a steady condition, a sputtering operation was started by supplying a high-frequency power having a frequency of 13.56 MHz to the target electrode 44. The sputtering operation as continued for 9 hours while controlling the high-frequency current in a manner to produce an electric power of 6.8 W/cm$^2$ for the graphite target electrode 44. As a result, light-yellow or colorless, transparent carbon films were produced on the respective glass substrates 62, 64 and 66.

During the sputtering operation, the temperatures of the glass substrates 62, 64 and 66 were 80° C. or less, 80° C. or less, 180° C., respectively. This indicates that the sputtering can be made under low temperature if the glass substrates are placed on the domain C. The forces of adhesion of the carbon films to the respective glass substrates were tested by exfoliating an adhesive tape sticked on each carbon films. None of the carbon films were separated from the respective glass substrates. In the exfoliation tests, the carbon films produced on the glass substrate 66 has proven superior to the carbon films produced on the other glass substrates 62 and 64. The carbon films produced on the glass substrate 62 exhibited a specific resistance greater than $1 \times 10^{12}$ $\Omega$·cm, the carbon films produced on the glass substrate 64 exhibited a specific resistance greater than $1 \times 10^{12}$ $\Omega$·cm, and the carbon films produced on the glass substrate 66 exhibited a specific resistance of $1 \times 10^{11}$ $\Omega$·cm. Carbon films were produced by the sputtering method under the same conditions except that only hydrogen gas was introduced to produce an atmosphere of hydrogen in the vacuum chamber. The carbon films produced on the glass substrate 62 exhibited a specific resistance of $1 \times 10^{11}$ $\Omega$·cm or more, the carbon films produced on the glass substrate 64 exhibited a specific resistance of $1 \times 10^{11}$ $\Omega$·cm or more, and the carbon films produced on the glass substrate 66 exhibited a specific resistance of $6 \times 10^{10}$ $\Omega$·cm. It can be seen that the carbon films produced in an atmosphere of nitrogen and hydrogen have a higher specific resistance than the carbon films produced in an atmosphere of hydrogen only.

FIG. 14 illustrates the results of a series of tests which were conducted to show the effect of mixed gas pressure P($N_2+H_2$), $N_2/H_2=25$ ppm, on carbon film infrared spectrum. Curve A illustrates carbon films produced at a mixed gas pressure of 40.0 Pa (0.3 Torr), curve B illustrates carbon films produced at a mixed gas pressure of 66.7 Pa (0.5 Torr), curve C illustrates carbon films produced at a mixed gas pressure of 100 Pa (0.75 Torr), and curve D illustrates carbon films produced at a mixed gas pressure of 267 Pa (2.0 Torr). These tests results have proven substantially similar to the results of tests conducted for carbon films produced under the same conditions except that only hydrogen gas was introduced to provide a gaseous atmosphere in the vacuum chamber.

Figure 15:
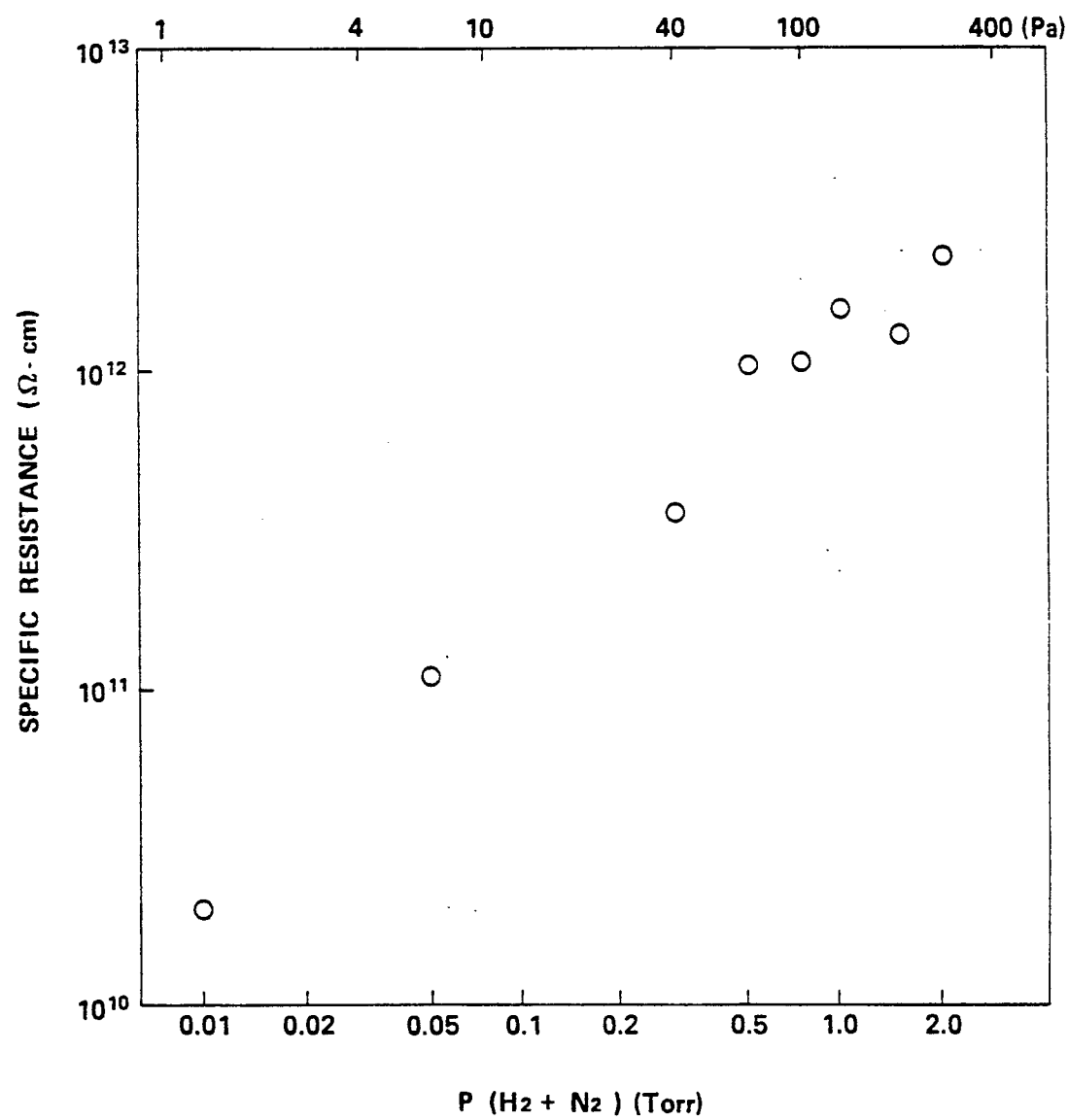
FIG. 15 is a graph showing the effect of mixed gas pressure $P(N_2+H_2)$ on carbon film specific resistance.

FIG. 15 illustrates the results of a number of tests which were conducted at different mixed gas pressures including 1.33 Pa (0.01 Torr), 6.67 Pa (0.05 Torr), 13.3 Pa (0.1 Torr), 40.0 Pa (0.3 Torr), 100 Pa (0.75 Torr), 133 Pa (1.0 Torr), 200 Pa (1.5 Torr) and 267 Pa (2.0 Torr) to show the effect of mixed gas pressure P($N_2+H_2$), $N_2/H_2=25$ ppm, on carbon film specific resistance. It is apparent from FIG. 16 that the carbon films produced by the method of the invention have high resistances. This corresponds to the fact that the carbon films are composed almost of $SP_3$ couplings and they have less $SP^2$ couplings which cause insulation resistance reduction.

Figure 16:
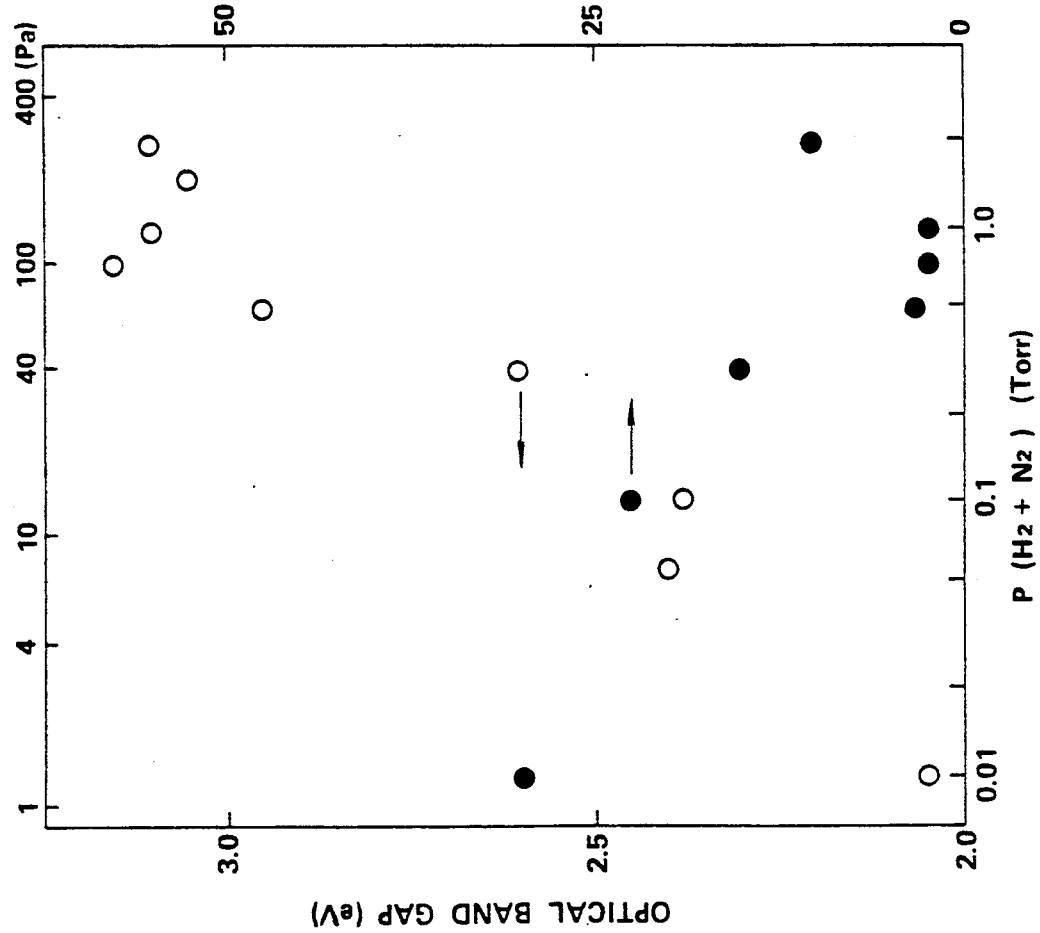
FIG. 16 is a graph showing the effect of mixed gas pressure $P(N_2+H_2)$ on carbon film optical band gap and spin density.

FIG. 16 illustrates the results of a series of tests which were conducted to show the effect of mixed gas pressure P($N_2+H_2$), $N_2/H_2=25$ ppm, on carbon film optical band-gap and spin density. The white points indicate optical band-gap values plotted with respect to given values of mixed gas pressure and the black points indicate spin density values plotted with respect to given values of mixed gas pressure. It is apparent from FIG. 16 that the carbon film produced according to the method of the invention has a good optical band-gap ranging from 2.05 to 3.15 eV and a small spin density ranging from $2 \times 10^{16}$ to $3 \times 10^{17}$/cm$^3$. It is, therefore, possible to provide a semiconductor having a desired characteristic by doping small quantities of impurities to the carbon film.

Figure 17:
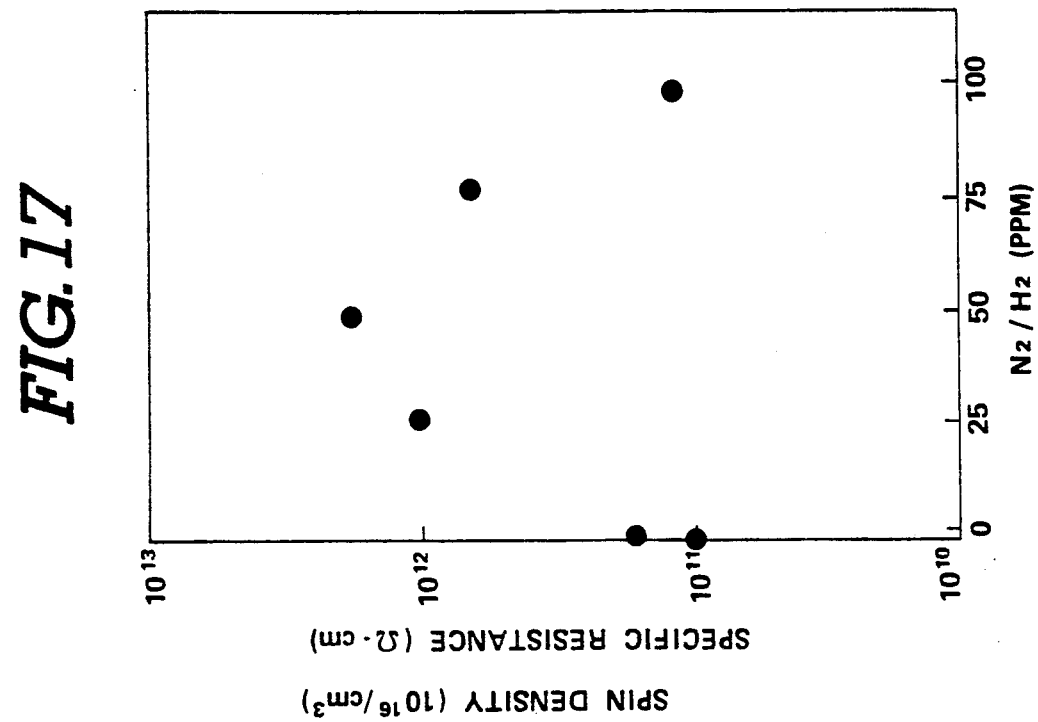
FIG. 17 is a graph showing the effect of gas mixing ratio $(N_2/H_2)$ on carbon film specific resistance.

FIG. 17 illustrates the results of a number of further tests which were conducted to show the effect of gas mixing ratio ($N_2/H_2$) on carbon film specific resistance. In these tests, the gas mixing ratio was changed in a range from 1 to 100 ppm while the mixed gas pressure was held at 66.7 Pa. The gas mixing ratio ranging from 1 to 100 ppm has proven satisfactory. If the gas mixing ratio is smaller than this range, the carbon film specific resistance is too small. If it is greater than the range, the carbon film specific resistance will be decreased to a level less than the specific resistance of carbon films produced by the sputtering method in an atmosphere of hydrogen only.

It is preferable that the mixed gas pressure be in the range from 0.7 Pa to 665 Pa (5 Torr). If the mixed gas pressure is smaller than this range, the carbon films will exhibit a low specific resistance and an undesirable spin density. If it is greater than the range, the infrared spectrum will have a greater absorption coefficient at a 2960 cm$^{-1}$ wave number, as shown in FIG. 14, causing a film quantity change and a spin density increase.

EXAMPLE 5

The vacuum chamber was evacuated to a pressure of $1.33 \times 10^{-5}$ Pa ($10^{-7}$ Torr) and then tetrofluoromethane ($CF_4$) and hydrogen ($H_2$) gases mixed at a mixing ratio ($CF_4/H_2$) of 5 ppm was introduced through the gas inlet pipe 26 into the vacuum chamber until the vacuum chamber pressure increases to 67 Pa (0.5 Torr). After the vacuum chamber pressure came into a steady condition, a sputtering operation was started by supplying a high-frequency power having a frequency of 13.56 MHz to the target electrode 44. The sputtering operation was continued for 9 hours while controlling the high-frequency current in a manner to produce an electric power of 6.8 W/cm$^2$ for the graphite target electrode 44. As a result, light-yellow or colorless, transparent carbon films were produced on the respective glass substrates 62, 64 and 66.

During the sputtering operation, the temperature of the glass substrate 62, 64 and 66 were 80° C. or less, 80° C. or less, 180° C., respectively. This indicates that the sputtering can be made under low temperature if the glass substrates are placed on the domain C. The forces of adhesion of the carbon films to the respective glass substrates were tested by exfoliating an adhesive tape sticked on each carbon films. None of the carbon films were separated from the respective glass substrates. In the exfoliation tests, the carbon films produced on the glass substrate 66 has proven superior to the carbon films produced on the other glass substrates 62 and 64. The carbon films produced on the glass substrate 62 exhibited a specific resistance greater than $1 \times 10^{12}$ $\Omega \cdot cm$, the carbon films produced on the glass substrate 64 exhibited a specific resistance greater than $1 \times 10^{12}$ $\Omega \cdot cm$, and the carbon films produced on the glass substrate 66 exhibited a specific resistance of $1 \times 10^{11}$ $\Omega \cdot cm$. Carbon films were produced by the sputtering method under the same conditions except that only hydrogen gas was introduced to produce an atmosphere of hydrogen in the vacuum chamber. The carbon films produced on the glass substrate 62 exhibited a specific resistance of $1 \times 10^{11}$ $\Omega \cdot cm$ or more, the carbon films produced on the glass substrate 64 exhibited a specific resistance of $1 \times 10^{11}$ $\Omega \cdot cm$ or more, and the carbon films produced on the glass substrate 66 exhibited a specific resistance of $6 \times 10^{10}$ $\Omega \cdot cm$. It can be seen that the carbon films produced in an atmosphere of tetrofluoromethane and hydrogen have a higher specific resistance than the carbon films produced in an atmosphere of hydrogen only.

Figure 18:
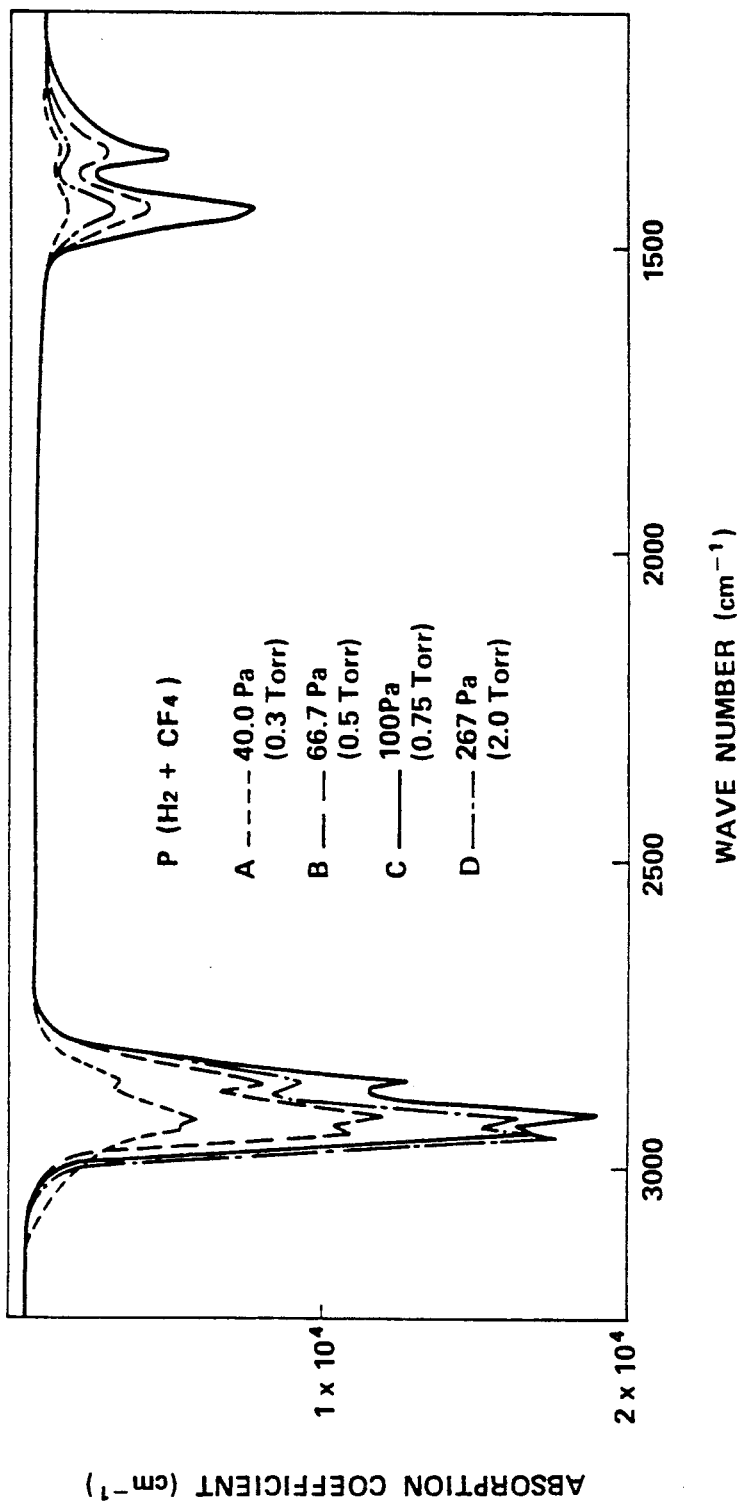
FIG. 18 is a graph showing the effect of mixed gas pressure $P(CF_4+H_2)$ on carbon film infrared ray spectrum.

FIG. 18 illustrates the results of a series of tests which were conducted to show the effect of mixed gas pressure $P(CF_4 + H_2)$, $CF_4/H_2 = 5$ ppm, on carbon film infrared spectrum. Curve A illustrates carbon films produced at a mixed gas pressure of 40.0 Pa (0.3 Torr), curve B illustrates carbon films produced at a mixed gas pressure of 66.7 Pa (0.5 Torr), curve C illustrates carbon films produced at a mixed gas pressure of 100 Pa (0.75 Torr), and curve D illustrates carbon films produced at a mixed gas pressure of 267 Pa (2.0 Torr). These test results have proven substantially similar to the results of tests conducted for carbon films produced under the same conditions except that only hydrogen gas was introduced to provide a gaseous atmosphere in the vacuum chamber.

Figure 19:
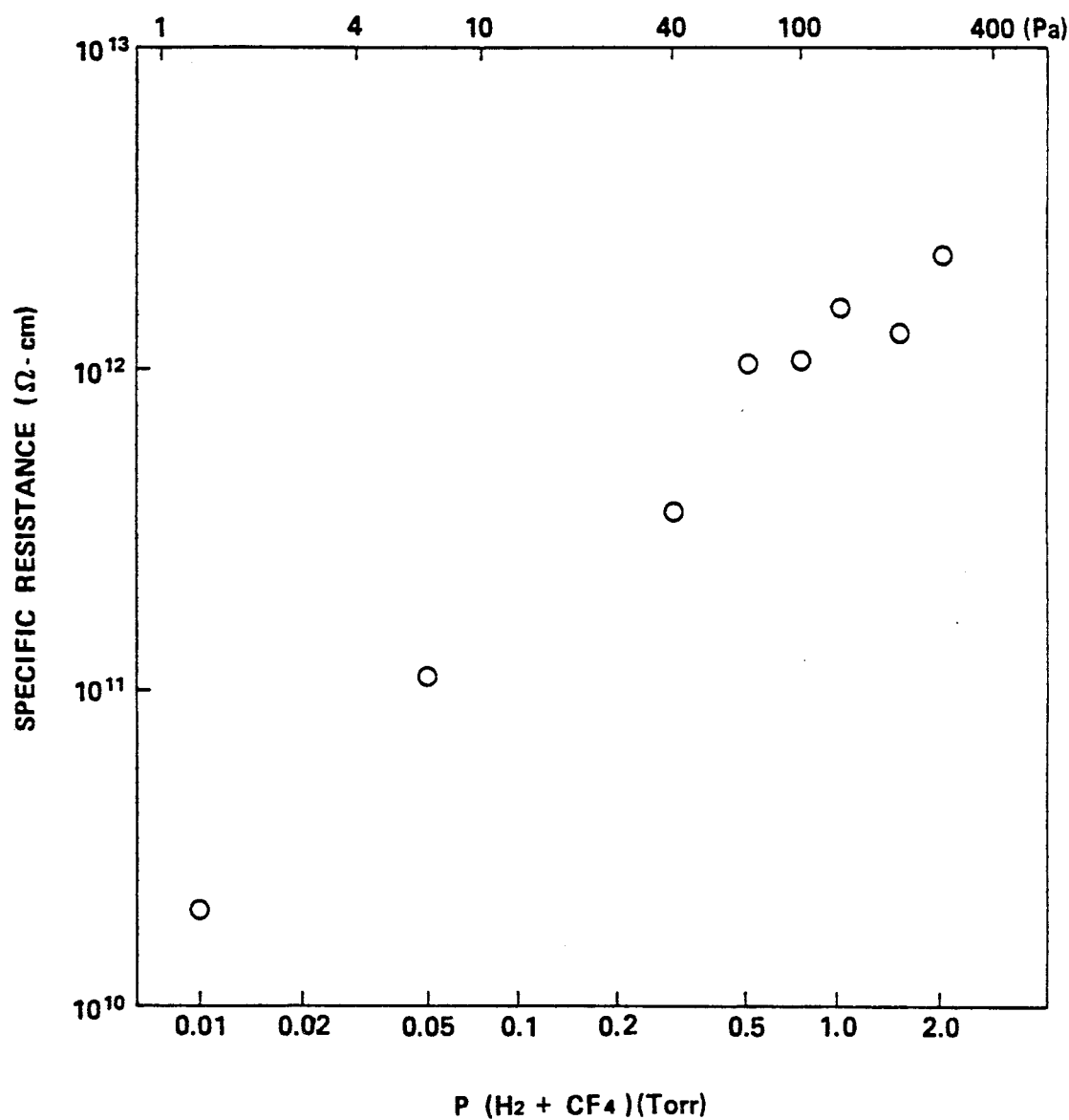
FIG. 19 is a graph showing the effect of mixed gas pressure $P(CF_4+H_2)$ on carbon film specific resistance.

FIG. 19 illustrates the results of a number of rtests which were conducted at different mixed gas pressures including 1.33 Pa (0.01 Torr), 6.67 Pa (0.05 Torr), 13.3 Pa (0.1 Torr), 40.0 Pa (0.3 Torr), 100 Pa (0.75 Torr), 133 Pa (1.0 Torr), 200 Pa (1.5 Torr) and 267 Pa (2.0 Torr) to show the effect of mixed gas pressure $P(CF_4 + H_2)$, $CF_4/H_2 = 5$ ppm, on carbon film specific resistance. It is apparent from FIG. 19 that the carbon films produced by the method of the invention have high resistances. This corresponds to the fact that the carbon films are composed almost of $SP^3$ couplings and they have less $SP^2$ couplings which cause insulation resistance reduction.

Figure 20:
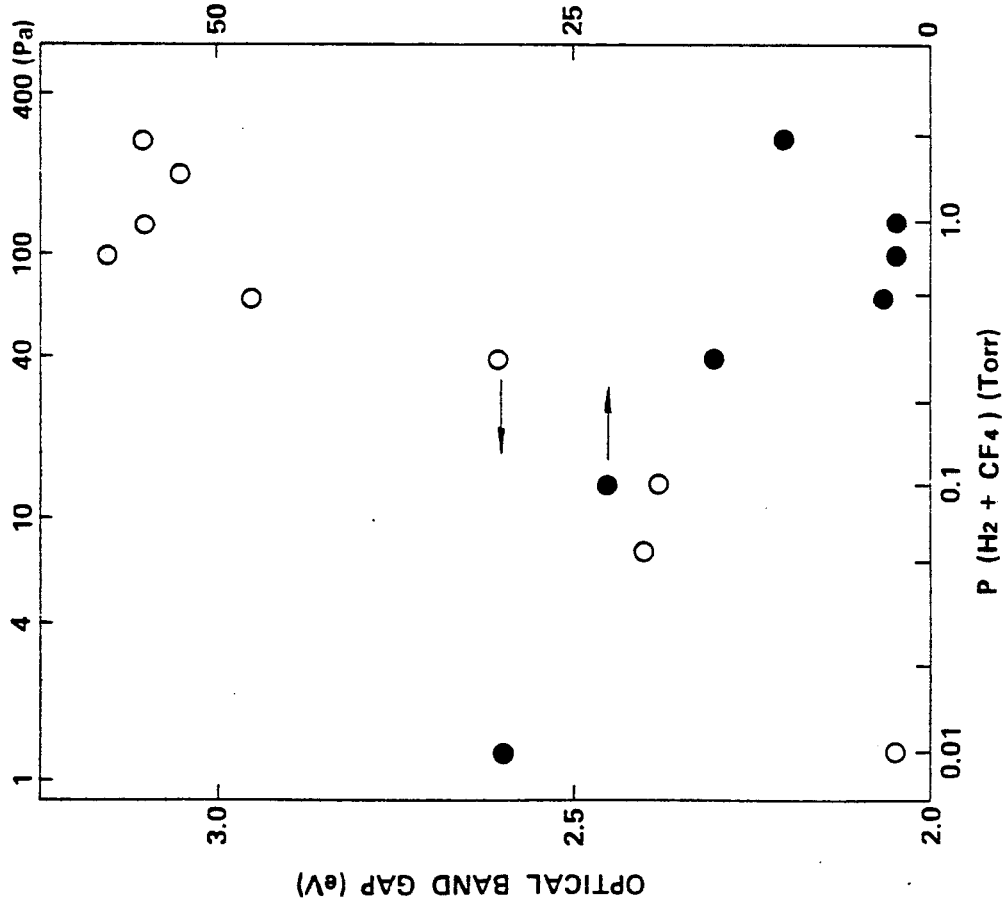
FIG. 20 is a graph showing the effect of mixed gas pressure $P(CF_4+H_2)$ on carbon film optical band gap and spin density.

FIG. 20 illustrates the results of a series of tests which were conducted to show the effect of mixed gas pressure $P(CF_4 + H_2)$, $CF_4/H_2 = 5$ ppm, on carbon film optical band-gap and spin density. The white points indicate optical band-gap values plotted with respect to given values of mixed gas pressure and the black points indicate spin density values plotted with respect to given values of mixed gas pressure. It is apparent from FIG. 20 that the carbon film produced according to the method of the invention has a good optical band-gap ranging from 2.05 to 3.15 eV and a small spin density ranging from $2 \times 10^{16}$ to $3 \times 10^{17}/cm^3$. It is, therefore, possible to provide a semiconductor having a desired characteristic by doping small quantities of impurities to the carbon film.

Figure 21:
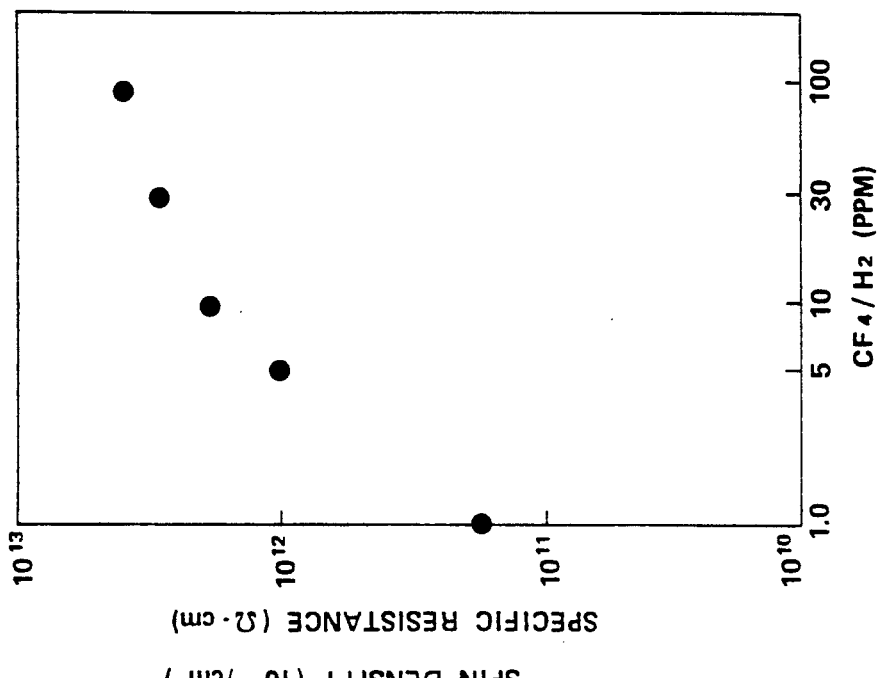
FIG. 21 is a graph showing the effect of gas mixing ratio $(CF_4/H_2)$ on carbon film specific resistance.

FIG. 21 illustrates the results of a number of further tests which were conducted to show the effect of gas mixing ratio ($CF_4/H_2$) on carbon film specific resistance. In these tests, the gas mixing ratio was changed in a range from 1 to 100 ppm while the mixed gas pressure was held at 66.7 Pa. The gas mixing ratio ranging from 1 to 100 ppm has proven satisfactory. If the gas mixing ratio is smaller than this range, the carbon film specific resistance is too small. If it is greater than the range, there will be a greater tendency of the tetrofluoromethane gas to corrode the vacuum vessel.

It is preferable that the mixed gas pressure be in the range from 0.7 Pa to 665 Pa (5 Torr). If the mixed gas pressure is smaller than this range, the carbon films will exhibit a low specific resistance and an undesirable spin density. If it is greater than the range, the infrared spectrum will have a greater absorption coefficient at a 2960 $cm^{-1}$ wave number, as shown in FIG. 18, causing a film quantity change and a spin density increase.

The tetrofluoromethane ($CF_4$) gas may be replaced by $C_2F_6$, $C_3F_8$, $C_5F_{12}$, $CHF_3$, or other carbon fluoride gases to achieve the same result.

It is apparent from the foregoing that the inventive method can produce carbon films having desired characteristics through simple control. The carbon films include less $SP^2$ coupling and have a high specific resistance. Since the carbon films can be produced under low temperatures and thus can be produced on any kind of substrates. It is also possible to produce carbon films having a very high light transmission coefficient. Since the carbon films are produced through a sputtering process, the carbon films are secured on the substrates under strong adhesion forces. The carbon films have a spin density lower than is obtained through prior art methods. This permits the carbon films to have a widen optical band gap so as to increase its specific resistance.

A heater may be provided for heating the substrates 62 and 64 in order to produce carbon films through a high-temperature process. Alternatively, a cooling pipe may be provided for passing a coolant such as water, liquid nitrogen or the like to cool the substrates 62 and 64 in order to produce carbon films through a low-temperature process.

While the present invention has been described in conjunction with specific embodiments thereof, it is evident that many alternatives, modifications and variations will be apparent to those skilled in the art. Accordingly, it is intended to embrace all alternatives, modifications and variations that fall within the scope of the appended claims.

What is claimed is:

1. A method of producing a carbon film on a substrate, comprising the steps of:
    placing the substrate in a vacuum chamber having a graphite target electrode placed therein;
    evacuating the vacuum chamber to a predetermined pressure;
    introducing a gaseous mixture into the vacuum chamber to produce a gaseous atmosphere therein at a pressure ranging from 0.7 Pa to 665 Pa, the gaseous mixture including dibrorane gas mixed at a ratio ranging from 1 ppm to 20 ppm to hydrogen gas; and releasing atomic particles from the graphite target electrode through a reactive sputtering process performed in the gaseous atmosphere, thereby depositing a carbon film on the substrate.

2. A method of producing a carbon film on a substrate, comprising the steps of:

placing the substrate in a vacuum chamber having a graphite target electrode placed therein;

evacuating the vacuum chamber to a predetermined pressure;

introducing a gaseous mixture into the vacuum chamber to produce a gaseous atmosphere therein at a pressure ranging from 0.7 Pa to 665 Pa, the gaseous mixture including oxygen gas mixed at a mixing ratio ranging from 1 ppm to 100 ppm to hydrogen gas; and releasing atomic particles from the graphite target electrode through reactive sputtering process performed in the gaseous atmosphere, thereby depositing a carbon film on the substrate.

3. A method of producing a carbon film on a substrate, comprising the steps of:

placing the substrate in a vacuum chamber having a graphite target electrode placed therein;

evacuating the vacuum chamber to a predetermined pressure;

introducing a gaseous mixture into the vacuum chamber to produce a gaseous atmosphere therein at a pressure ranging from 0.7 Pa to 665 Pa, the gaseous mixture including carbon fluoride gas mixed at a mixing ratio ranging from 1 ppm to 100 ppm to hydrogen gas; and releasing atomic particles from the graphite target electrode through a reactive sputtering process performed in the gaseous atmosphere, thereby depositing a carbon film on the substrate.

4. The method as claimed in claim 3, wherein the carbon fluoride gas is one selected from a group consisting $CF_4$, $C_2F_6$, $C-C_4F_8$, $C_5F_{12}$, and $CHF_3$.

* * * * *